US008242988B2

(12) United States Patent
Yamazaki et al.

(10) Patent No.: US 8,242,988 B2
(45) Date of Patent: Aug. 14, 2012

(54) DEVICE SUBSTRATE, LIGHT EMITTING DEVICE AND DRIVING METHOD OF LIGHT EMITTING DEVICE

(75) Inventors: Shunpei Yamazaki, Setagaya (JP); Masayuki Sakakura, Atsugi (JP); Mitsuaki Osame, Atsugi (JP); Takashi Hamada, Atsugi (JP); Tamae Takano, Atsugi (JP); Yu Yamazaki, Setagaya (JP); Aya Anzai, Tsukui (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/915,086

(22) Filed: Oct. 29, 2010

(65) Prior Publication Data

US 2011/0043513 A1 Feb. 24, 2011

Related U.S. Application Data

(62) Division of application No. 10/803,190, filed on Mar. 18, 2004, now Pat. No. 7,843,408.

(30) Foreign Application Priority Data

| Mar. 19, 2003 | (JP) | 2003-076462 |
| Apr. 11, 2003 | (JP) | 2003-108357 |
| May 16, 2003 | (JP) | 2003-139590 |

(51) Int. Cl.
*G09G 3/30* (2006.01)
(52) U.S. Cl. .............. 345/77; 345/76; 345/80; 345/82
(58) Field of Classification Search .............. 345/55, 345/76, 77, 80, 82, 98, 99, 100, 204, 205, 345/206
See application file for complete search history.

(56) References Cited

U.S. PATENT DOCUMENTS

| 6,229,531 B1 | 5/2001 | Nakajima et al. |
| 6,246,180 B1 | 6/2001 | Nishigaki |
| 6,359,606 B1 | 3/2002 | Yudasaka |
| 6,392,628 B1 | 5/2002 | Yamazaki et al. |
| 6,512,504 B1 | 1/2003 | Yamauchi et al. |
| 6,545,291 B1 | 4/2003 | Amundson et al. |
| 6,570,552 B2 | 5/2003 | Yamazaki |
| 6,624,669 B1 | 9/2003 | Tsuchi |
| 6,714,183 B2 | 3/2004 | Yamazaki et al. |
| 6,742,762 B2 | 6/2004 | Koyama |
| 6,765,552 B2 | 7/2004 | Yamazaki et al. |
| 6,774,877 B2 | 8/2004 | Nishitoba et al. |
| 6,798,148 B2 | 9/2004 | Inukai |
| 6,859,193 B1 | 2/2005 | Yumoto |
| 6,909,240 B2 | 6/2005 | Osame et al. |
| 6,909,242 B2 | 6/2005 | Kimura |
| 6,930,328 B2 | 8/2005 | Kimura et al. |
| 7,141,934 B2 | 11/2006 | Osame et al. |
| 7,173,586 B2 | 2/2007 | Osame et al. |
| 7,193,591 B2 | 3/2007 | Yumoto |
| 7,306,981 B2 * | 12/2007 | Kuwabara et al. ............ 438/166 |
| 7,336,251 B2 | 2/2008 | Osada |
| 7,345,657 B2 | 3/2008 | Kimura |
| 7,358,942 B2 * | 4/2008 | Yamazaki et al. .............. 345/82 |
| 7,379,039 B2 | 5/2008 | Yumoto |
| 7,388,564 B2 | 6/2008 | Yumoto |
| 7,445,946 B2 | 11/2008 | Yamazaki et al. |
| 7,456,810 B2 | 11/2008 | Kimura |
| 7,528,799 B2 | 5/2009 | Inukai |
| 7,583,032 B2 | 9/2009 | Kimura |
| 7,592,975 B2 | 9/2009 | Yamazaki et al. |
| 7,612,753 B2 | 11/2009 | Koyama |
| 7,633,471 B2 | 12/2009 | Yamazaki et al. |
| 7,714,818 B2 | 5/2010 | Osame et al. |
| 7,723,721 B2 | 5/2010 | Udagawa et al. |
| 7,843,408 B2 * | 11/2010 | Yamazaki et al. .............. 345/77 |
| 2004/0065902 A1 | 4/2004 | Yamazaki et al. |
| 2004/0130262 A1 | 7/2004 | Yoneda |
| 2004/0227749 A1 | 11/2004 | Kimura |
| 2005/0012686 A1 | 1/2005 | Osame et al. |
| 2007/0064469 A1 | 3/2007 | Umezaki |
| 2007/0085796 A1 | 4/2007 | Osame et al. |
| 2007/0126666 A1 | 6/2007 | Yamazaki et al. |

FOREIGN PATENT DOCUMENTS

| EP | 1 061 497 | 12/2000 |
| EP | 1 130 565 | 9/2001 |
| EP | 1 296 310 | 3/2003 |
| EP | 1 310 997 | 5/2003 |
| EP | 1 341 148 | 9/2003 |
| JP | 2000-221942 | 8/2000 |
| JP | 2000-235370 | 8/2000 |
| JP | 2000-259098 | 9/2000 |
| JP | 2000-347621 | 12/2000 |
| JP | 2001-042822 | 2/2001 |
| JP | 2001-060076 | 3/2001 |
| JP | 2003-005710 | 1/2003 |
| JP | 2003-058107 | 2/2003 |
| JP | 2003-255896 | 9/2003 |
| JP | 2004-054200 | 2/2004 |
| JP | 2004-126106 | 4/2004 |
| JP | 2004-253266 | 9/2004 |
| JP | 2004-361424 | 12/2004 |
| WO | 01/06484 | 1/2001 |

* cited by examiner

*Primary Examiner* — My-Chau T Tran
(74) *Attorney, Agent, or Firm* — Eric J. Robinson; Robinson Intellectual Property Law Office, P.C.

(57) ABSTRACT

A light emitting device comprising a light emitting element and a first transistor and a second transistor controlling current to be supplied to the light emitting element in a pixel; the first transistor is normally-on; the second transistor is normally-off; a channel length of the first transistor is longer than a channel width thereof; a channel length of the second transistor is equal to or shorter than a channel length thereof; gate electrodes of the first transistor and the second transistor are connected to each other; the first transistor and the second transistor have the same polarity; and the light emitting element, the first transistor and the second transistor are all connected in series.

6 Claims, 17 Drawing Sheets

DEVICE SUBSTRATE, LIGHT EMITTING DEVICE AND DRIVING METHOD OF LIGHT EMITTING DEVICE

TECHNICAL FIELD

The present invention relates to a light emitting device having a plurality of pixels including a means for supplying an electronic current to a light emitting element and a light emitting element, and further to a driving method of the light emitting device.

BACKGROUND ART

Since a light emitting element is self-luminous type, it has a high level of visibility and does not require a backlight that is needed in a liquid crystal display device (LCD). This, it is suitably applied to thinner devices and not restricted in viewing angle. Therefore, a light emitting device using a light emitting element has recently been drawing attentions as a substitute display device for a CRT and an LCD.

An OLED (Organic Light Emitting Diode) is one example of light emitting elements and includes a layer containing an electroluminescent material that can obtain electroluminescence generated by applying an electric field thereto (referred to as an electroluminescent layer), an anode layer and a cathode layer. The electroluminescent layer is provided between the anode and the cathode, and further, comprises one or a plurality of layers. These layers may contain an inorganic compound in some cases. The electroluminescence in an electroluminescent layer includes a light emission when a singlet excited state returns to a ground state (fluorescence) and a light emission when a triplet excited state returns to a ground state (phosphorescence).

Next, a structure of a pixel of a conventional light emitting device and the driving method thereof will be described briefly. A pixel shown in FIG. 10 has TFTs 80 and 81, a capacitor element 82 and a light emitting element 83. A gate of the TFT 80 is connected to a scanning line 85. A source or a drain of the TFT 80 s connected to a signal line 84, and the other is connected to a gate of the TFT 81. A source of the TFT 81 is connected to a terminal 86. A drain of the TFT 81 is connected to an anode of the light emitting element 83. A cathode of the light emitting element 83 is connected to a terminal 87. The capacitor element 82 is provided for storing a voltage between the gate and the source of the TFT 81. A predetermined amount of voltages is applied from a power source to each of the terminals 86 and 87, which have a voltage difference from each other. The term voltage in this specification means an electrical difference from a ground, unless especially mentioned.

A voltage of a video signal inputted to the signal line 84 is inputted into the gate of the TFT 81 when the TFT 80 turns ON by a voltage of the scanning line 85. A gate voltage (a voltage difference between the gate and the source) of the TFT 81 is determined according to the inputted voltage of the video signal. Moreover, a drain current of the TFT 81 that flows according to the gate voltage is supplied to the light emitting element 83, and the light emitting element 83 emits light by the supplied current.

DISCLOSURE OF INVENTION

Problems to be Solved by the Invention

Now, a TFT formed from polysilicon has a higher field effect mobility and a higher ON current than a TFT formed from amorphous silicon. Therefore, the TFT formed from polysilicon is more suitable for a transistor of a light emitting device. However, after all, the electrical characteristics are inferior to characteristics of a MOS transistor that is formed over a single crystal substrate though a TFT is formed from polysilicon. For example, the field effect mobility is equal to one-tenth or less than that of a single crystalline silicon. Moreover, the TFT formed by using polysilicon has a problem that it tends to have a variable characteristic due to a defect formed on grain boundaries.

In the pixel shown in FIG. 10, there is a problem that the amount of the drain current of the TFT 81 is different in each pixel when a threshold voltage of the TFT81 varies in each pixel even though a voltage of a video signal is same, and consequently, the luminance of the light emitting element 83 varies.

Moreover, a decrease in a luminance of a light emitting element by a deterioration of an electroluminescent material is a serious problem in putting a light emitting device to practical use. The luminance decreases when electroluminescent materials deteriorate even if a current that is supplied to a light emitting element is constant. Thus, there is a problem that differences of a deterioration of a light emitting element are generated in each pixel and that the luminance has a variation in the case where a gradation of each pixel is different corresponding to a displayed image, since the degree of the deterioration depends on time of luminescence or the quantity of the flowing current.

In view of the above-described problems, it is an object of the present invention to provide a light emitting device, a driving method of the light emitting element, and a device substrate which can suppress a variation of a luminance of a light emitting element in each pixel due to a difference in characteristics of TFT, and which can suppress a decrease in luminance of a light emitting element or a generation of an unevenness in luminance accompanying a deterioration of an electroluminescent material.

Means for Solving the Problems

In the present invention, in addition to a transistor that supplies current to a light emitting element (a driving transistor), a transistor that functions as a switching element (a current control transistor) connects in series to the driving transistor. Both of the driving transistor and the current control transistor have the same polarity, and further, the gate electrodes of them are connected to each other. Moreover, in the present invention, a ratio of L/W of a channel length L to a channel width W of the driving transistor is allowed to be higher than L/W of the current control transistor. In addition, the driving transistor operates in the saturated region and the current control transistor is allowed to operate in the linear region. Specifically, in the driving transistor, L is allowed to be higher than W, and more preferably, L/W is allowed to be 5/1 or more. In addition, in the current control transistor, L is allowed to be equal or shorter than W.

Moreover, in this specification, a light emitting element indicates an element whose luminance is controlled by current or voltage, and includes an OLED (Organic Light Emitting Diode) and a MIM type electron source element (an electron emission element) and the like which is used for an FED (Field Emission Display).

A light emitting device includes a panel in which a light emitting element is sealed, and a module in which an IC and the like including a controller are mounted on the panel. Moreover, the present invention relates to a device substrate that corresponds to one of the modes before a light emitting element is completed in the steps of manufacturing the light emitting device, and the device substrate is provided with a means for supplying current into a light emitting element in each of the plural pixels.

Moreover, in the present invention, a threshold voltage Vth of the driving transistor is set to be higher than that of the current control transistor in the case where each polarity of the driving transistor and the current control transistor is p-type. Conversely, in the case where each polarity of the driving transistor and the current control transistor is n-type, a threshold voltage Vth of the driving transistor is set to be lower than that of the current control transistor. A control of the threshold voltage can be performed by adjusting dose, or the like, of an impurity that gives a conductive type to a channel forming region. The current control transistor is allowed to be invariably normally-off. The driving transistor may be normally-off, but normally-on is more preferable.

FIG. 1A is a circuit diagram showing a part of a pixel of the present invention. The reference numeral 101 is a driving transistor, the reference numeral 102 is a current control transistor, and the reference numeral 103 is a light emitting element. FIG. 1A shows a case where the driving transistor 101 and the current control transistor 102 are each p-type, but they may also be n-type. The driving transistor 101, the current control transistor 102 and the light emitting element 103 are connected in series, and has a structure in which a drain current Id of the two transistors 101 and 102 is supplied to the light emitting element 103. In addition, gate electrodes of the driving transistor 101 and the current control transistor 102 are connected to each other. An electric potential that is given to a terminal 106 is given to the gate electrodes of both of the driving transistor 101 and the current control transistor 102.

Moreover, a voltage Vdd is applied between a terminal 104 that is connected to a source (S) of the driving transistor 101 and a terminal 105 that is connected to a cathode of the light emitting element 103. The driving transistor 101, the current control transistor 102, and the light emitting element 103 are all connected in series. Therefore, the sum of a drain voltage Vds1 of the driving transistor 101, a drain voltage Vds2 of the current control 102, and a voltage Vel between an anode and the cathode of the light emitting element 103 corresponds to a voltage Vdd.

In addition, in FIG. 1A, the current control transistor 102 is provided between the driving transistor 101 and the light emitting element 103, but the present invention is not limited to this structure. The current control transistor 102 may be connected to control a supply of the drain current of the driving transistor 101 to the light emitting element 103.

FIG. 1B shows the voltage-current characteristics of the driving transistor 101, the current control transistor 102, and the light emitting element 103 which are shown in FIG. 1A. In addition, the graph of the voltage-current characteristics shown in FIG. 1B shows a graph 110 which indicates the relation of the drain current Id to the drain voltage Vds1 of the driving transistor 101, a graph 111 which indicates the relation of the drain current Id to the drain voltage Vds2 of the current control transistor 102, and a graph 112 which indicates the relation of the current flowing in the light emitting element 103 to the voltage Ve1.

Since the driving transistor 101, the current control transistor 102, and the light emitting element 103 are connected in series, the height of a value of the current Id which flows in each element is the same. Moreover, the driver circuit 101 operates in the saturated region, and the current control transistor 102 operates in the linear region. Therefore, the drain current Id1 at the intersection point n1 (operation point) of the graph 110 of the graph 112 is lower than the drain current Id2 at the intersection point n2 (operation point) of the graph 111 of the graph 112. Therefore, the driving transistor 101 and the light emitting element 103 operates in the operation point n1, and the current control transistor 102 operates so that the drain current is Id1 since the current which flows in each element is Id1.

At this time, Ve1 is a voltage between an electric potential of the cathode and an electric potential of the operation point, and Vds1+Vds2 is a voltage between an electric potential of the terminal 106 and an electric potential of the operation point. Moreover, |Vds2| is notably small in comparison with |Ve1| and |Vds1| since the current control transistor 102 operates in the linear region. Therefore, it can be said that Vdd≈Ve1+Vds1. In addition, in the case where the operation point n1 is in the saturated region, the drain current Id1 of the driving transistor 101 follows the next numeral 1. In the numeral 1, $\beta=\mu C_0 W/L$, $\mu$ indicates a mobility, $C_0$ indicates a gate capacitance per unit area, and W/L indicates a ratio of a channel width W to a channel length L of a channel forming region.

$$Id1=\beta(Vgs-Vth)^2/2 \qquad \text{[numeral 1]}$$

From the equation shown in the numeral 1, it can be said that the current Id1 is determined only with Vgs, not Vds1. Therefore, when the voltage Vdd is a fixed value, the value of the drain current Id is kept constant according to the equation shown in the numeral 1, even when the value of Vds becomes low, instead of making the value of Ve1 high due to a deterioration of the light emitting element. Consequently, a decline of luminance can be suppressed even when the light emitting element deteriorates, since luminance of the light emitting element is in proportion to the current.

Incidentally, in the case where both of the driving transistor 101 and the current control transistor 102 each operate in the linear region, Ve1 is notably high with respect to the sum of the drain voltage Vds1 and Vds2. That is, it can be said that Vdd≈Ve1 because of Ve1>>Vds1+Vds2. Thus, the value of Ve1 is almost fixed even though the light emitting element deteriorates, and therefore, a decrease of luminance cannot be suppressed. Accordingly, an advantage that can suppress a decrease of luminance due to a deterioration of a light emitting element can be obtained by making the driving transistor 101 operate in the saturated region, which cannot be obtained with the operation in the linear region.

However, there is a problem that the current which is flowing in the light emitting element is dependent on a variation of the threshold voltage Vth as the numeral 1 shows, since a ratio of |Vgs| to |Vth| in the saturated region is smaller than in the linear region. In the present invention, the absolute value of a gate over drive voltage (the gate voltage Vgs−the threshold voltage Vth) of the current control transistor 102 can be allowed to be higher than that of the driving transistor 101, even though a gate voltage in the same height is applied by controlling the threshold voltage. More specifically, the gate over drive voltage has a negative value in the case where the driving transistor 101 is p-type, and has a positive value in the case where the driving transistor 101 is n-type. Therefore, in the saturated region, the operation point can be set in an area where a linearity of an ON current to Vgs is higher, thus a variation of the ON current can be suppressed in comparison with the case of normally-off, even though the threshold voltage, the sub threshold coefficient, the mobility or the like varies.

Moreover, in the present invention, the variation of the ON current due to the variation of the threshold voltage, the sub threshold coefficient, the mobility or the like can be more suppressed, since a linearity of the saturated region is made high by raising L/W. In addition, higher ON current can be obtained even though the height of the gate voltage is same, since the gate over drive voltage is higher than in the case of normally-off, and a decrease of the ON current can be compensated by raising L/W.

EFFECT OF THE INVENTION

By the above-mentioned structure, the present invention can suppress a variation of luminance of a light emitting element between each pixel, due to a difference of characteristics of a transistor. Moreover, the present invention can suppress a decrease in luminance of a light emitting element accompanying a deterioration of an electroluminescent material or a generation of an unevenness in luminance.

BEST MODE FOR CARRYING OUT THE INVENTION

Hereinafter, embodiment modes of the present invention will be described with reference to the drawings. However, the present invention can be carried out in various different modes, and it is easily understood by those who are in the art that the modes and details herein disclosed can be modified in various ways without departing from the scope and spirit of the present invention. Therefore, it should be noted that the present invention should not be interpreted as limiting to the present embodiment modes.
(Embodiment Mode 1)

FIG. 2 shows one embodiment mode of a pixel that is included in a light emitting device of the present invention. The pixel shown in FIG. 2 includes a light emitting element 204, a transistor (a switching transistor) 201 which is used as a switching element to control inputting a video signal to the pixel, and two transistors 202 and 203 which control supply of current to the light emitting element. In this embodiment mode, the transistor 202 corresponds to a driving transistor, and the transistor 203 corresponds to a current control transistor. Moreover, a capacitor element 205 to store an electric potential of the video signal may be provided in the pixel as the embodiment mode.

The switching transistor 201 may be n-type or p-type. The driving transistor 202 and the current control transistor 203 each have the same polarity. In this embodiment mode, each of them has a p-type, but they may have an n-type. And a threshold voltage of the driving transistor 202 is set to be higher than that of the current control transistor 203. More preferably, the driving transistor 202 is set to be normally-on. Moreover, in the present invention, L/W of the driving transistor 202 is set to be higher than L/W of the current control transistor 203. In addition, the driving transistor 202 is allowed to operate in the saturated region, and the current control transistor 203 is allowed to operate in the linear region. Specifically, in the driving transistor 202, L is allowed to be higher than W, and more preferably, the L/W is allowed to be 5/1 or more. In addition, in the current control transistor 203, L is allowed to be equal to or shorter than W.

Moreover, a gate of the switching transistor 201 is connected to a scanning line Gj (j=1 to y). One of the source and the drain of the switching transistor 201 is connected to a signal line Si (i=1 to x), and the other is connected to each gate of the driving transistor 202 and the current control transistor 203. The driving transistor 202 and the current control transistor 203 are connected in series. In addition, the driving transistor 202 and the current control transistor 203 are connected to a power supply line Vi (i=1 to x) and the light emitting element 204 so that a current which is supplied from the power supply line Vi is supplied to the light emitting element 204 as a drain current of the driving transistor 202 and of the current control transistor 203. In this embodiment, a source of the current control transistor 203 is connected to the power supply line Vi (i=1 to x), and a drain of the driving transistor 202 is connected to a pixel electrode of the light emitting element 204.

The light emitting element 204 includes an anode, a cathode and an electroluminescent layer provided between the anode and the cathode. When the anode is connected to either the driving transistor 202 or the current control transistor 203, the anode is a pixel electrode and the cathode is a counter electrode. Meanwhile, when the cathode is connected to either the driving transistor 202 or the current control transistor 203, the cathode is the pixel electrode and the anode is a counter electrode. A voltage is applied from a power supply to each of the counter electrode of the light emitting element 204 and the power supply line Vi so as to supply a forward bias current to the light emitting element 204.

One of the two electrodes of the capacitor element 205 is connected to the power supply line Vi, and the other is connected to each gate of the driving transistor 202 and the current control transistor 203. The capacitor element 205 is provided to store a gate voltage of the driving transistor 202 and of the current control transistor 203, when the switching transistor 201 is in an unselected state (off-state). Although a structure in which the capacitor element 205 is provided is shown in FIG. 2, the present invention is not limited to this structure, and the capacitor element 205 is not necessarily provided.

In the case where the source or the drain of the driving transistor 202 is connected to the anode of the light emitting element 204, it is desirable that the driving transistor 202 is a p-channel type transistor. On the other hand, in the case where the source or the drain of the driving transistor 202 is connected to the cathode of the light emitting element 204, it is desirable that the driving transistor 202 is an n-channel type transistor.

Next, a method of driving of the pixel shown in FIG. 2 is described. An operation of the pixel shown in FIG. 2 can be explained by dividing into two periods: a writing period and a storage period. First, when the scanning line Gj is selected in the writing period, the switching transistor 201 whose gate is connected to the scanning line Gj turns ON. Next, a video signal that is inputted to the signal lines S1 to Sx is inputted to each gate of the driving transistor 202 and the current control transistor 203 via the switching transistor 201. FIG. 3A shows an operation in the case where the driving transistor 202 and the current control transistor 203 are ON by the video signal, and FIG. 3B shows an operation in the case where the current control transistor 203 is OFF. In addition, in FIGS. 3A to 3D, the switching transistor 201 which is used as the switching element and the current control transistor 203 each are shown as a switch.

As shown in FIG. 3A, in the case where the driving transistor 202 and the current control transistor 203 turn ON by the video signal, a current is supplied to the light emitting element 204 via the power supply line Vi. At this time, the current which flows in the light emitting element 204 is determined by the voltage-current characteristics of the driving transistor 202 which operates in the saturated region and the light emitting element 204, since the current control transistor 203 operates in the linear region at this time. And, the light emitting element 204 emits light at a height of luminance which measures up to the supplied current.

Moreover, as shown in FIG. 3B, in the case where the current control transistor 203 turns OFF by the video signal, the supply of the current to the light emitting element is not carried out and the light emitting element 204 does not emit light. Note that according to the present invention, it is possible to control not to supply the current to the light emitting element 204 can be done, since the current control transistor 203 is normally-off even when the driving transistor 202 is normally-on.

In the storage period, the switching transistor 201 is turned OFF by controlling an electric potential of the scanning line Gj, and then an electric potential of the video signal that is written in the writing period is stored. FIG. 3C shows an operation in the storage period in the case where both of the driving transistor 202 and the current control transistor 203 are turned ON in the writing period as shown in FIG. 3A. The supply of the current to the light emitting element 204 is maintained, since the electric potential of the video signal is stored in the capacitor element 205. Moreover, FIG. 3D shows an operation in the storage period in the case where the current control transistor 203 turns OFF in the writing period as shown in FIG. 3B. The supply of the current to the light emitting element 204 is not carried out as in the writing period, since the electric potential of the video signal is stored in the capacitor element 205.

Note that, in the pixel that is shown in this embodiment mode, the video signal can be either a digital signal or an analog signal. In the case of a digital signal, a gradation can be expressed by dividing one frame period to a plurality of periods (sub frame period), and controlling light emission or non-light emission in each period by the video signal. Moreover, in the case of an analog signal, a gradation can be expressed by controlling an ON current of the driving transistor with the electric potential of the video signal.

By the above-mentioned structure, a variation of luminance of a light emitting element between each pixel can be suppressed, due to a difference of characteristics of a transistor. Moreover, a decrease in luminance of a light emitting element or a generation of an unevenness in luminance can be suppressed due to a deterioration of an electroluminescent material.

(Embodiment Mode 2)

In this embodiment mode, a pixel that is included in a light emitting device of the present invention and that is different from the mode in FIG. 2 is described.

A pixel that is shown in FIG. 4A includes a light emitting element 404, a switching transistor 401, a driving transistor 402, a current control transistor 403, and a transistor (an erasing transistor) 406 to erase an electric potential of a video signal that is written in. The switching transistor 401 and the erasing transistor 406 each may be n-type or p-type. A capacitor element 405 can be provided for a pixel in addition to the above-mentioned elements. The driving transistor 402 and the current control transistor 403 each have the same polarity. In this embodiment mode, each of them has a p-type, but may have an n-type. Moreover, a threshold voltage, a value of L/W and an operating region of the driving transistor 402 and the current control transistor 403 may be set in the same way as the case of the embodiment mode 1.

A gate of the switching transistor 401 is connected to a first scanning line Gaj (j=1 to y). One of the source and the drain of the switching transistor 401 is connected to a signal line Si (i=1 to x), and the other is connected to each gate of the driving transistor 402 and the current control transistor 403. Moreover, a gate of the erasing transistor 406 is connected to a second scanning line Gej (j=1 to y). One of the source and the drain of the erasing transistor 406 is connected to a power supply line Vi (i=1 to x), and the other one is connected to each gate of the driving transistor 402 and of the current control transistor 403. The driving transistor 402 and the current control transistor 403 are connected in series. In addition, the driving transistor 402 and the current control transistor 403 are connected to the power supply line Vi and the light emitting element 404 so that a current which is supplied from the power supply line Vi is supplied to the light emitting element 404 as a drain current of the driving transistor 402 and the current control transistor 403. In FIG. 4A, a source of the current control transistor 403 is connected to the power supply line Vi, and a drain of the driving transistor 402 is connected to a pixel electrode of the light emitting element 404. A voltage is applied from a power supply to each of a counter electrode of the light emitting element 404 and the power supply line Vi so as to supply a forward bias current to the light emitting element 404. One of the two electrodes of the capacitor element 505 is connected to the power supply line Vi, and the other is connected to each gate of the driving transistor 402 and of the current control transistor 403.

In the case where a source or the drain of the driving transistor 402 is connected to an anode of the light emitting element 404, it is desirable that the driving transistor 402 is a p-channel type transistor. Moreover, in the case where the source or the drain of the driving transistor 402 is connected to a cathode of the light emitting element 404, it is desirable that the driving transistor 402 is an n-channel type transistor.

The pixel shown in FIG. 4A can be described by classifying the operation into a writing period, a storage period, and an erasing period. Operations of the switching transistor 401, the driving transistor 402, and the current control transistor 403 in the writing period and the storage period are the same as in the case of FIG. 2. In the erasing period, the erasing transistor 406 turns ON when the second scanning line Gej is selected. Each electric potential of the power supply line V1 to Vx is supplied to the gate of the driving transistor 402 and the current control transistor 403 via the erasing transistor 406. Therefore, the current control transistor 403 turns OFF, and thus a state that the current is not compulsorily supplied to the light emitting element 404 is made.

Next, another mode of a pixel that is included in a light emitting device of the present invention and that is different from the mode in FIG. 2 is described.

A pixel shown in FIG. 4B includes a light emitting element 414, a switching transistor 411, a driving transistor 413, and a current control transistor 412. A capacitor element 415 may be provided in the pixel in addition to the above-mentioned elements. The driving transistor 413 and the current control transistor 412 each have the same polarity. In this embodiment mode, each of them has a p-type, but may have an n-type. Moreover, a threshold voltage, a value of L/W and an operating region of the driving transistor 413 and the current control transistor 412 may be set in the same way as the embodiment mode 1. In the pixel shown in the FIG. 4B, the current control transistor 412 is provided between the driving transistor 413 and the light emitting element 414, which is different from FIG. 2. Thus, the current control transistor 412 may be provided in a position in which a supply of a drain current of the driving transistor 413 to the light emitting element 414 can be controlled.

Moreover, a device substrate corresponds to one mode before completing a light emitting element in a process of manufacturing a light emitting device of the present invention.

A transistor that is used in a light emitting device of the present invention may be a transistor which is formed by using a single crystalline silicon, a transistor using an SOI, or a thin film transistor using a polycrystalline silicon (polysilicon) or an amorphous silicon. Moreover, a transistor using an organic semiconductor or a transistor using a carbon nanotube may be used. In addition, a transistor which is provided for the pixel of the light emitting device of the present invention may have a single gate structure, a double gate structure or a multi gate structure which has more gate electrodes.

[Embodiment 1]

In this embodiment, one embodiment of a top view of the pixel shown in FIG. 4A is described. FIG. 5 shows a top view of a pixel of this embodiment. The reference numeral 1001 corresponds to a signal line, the reference numeral 1002 corresponds to a power supply line, the reference numeral 1004 corresponds to a first scanning line, and the reference numeral 1003corresponds to a second scanning line. In this embodiment, the signal line 1001 and the power supply line 1002 are formed from the same conductive film, and the first scanning line 1004 and the second scanning line 1003are formed from the same conductive film. In addition, 1005 is a switching transistor, and a part of the first scanning line 1004 functions as a gate electrode thereof. Moreover, the reference numeral 1006 is an erasing transistor, and a part of the second scanning line 1003functions as a gate electrode thereof. The reference numeral 1007 corresponds to a driving transistor, and the reference numeral 1008 corresponds to a current control transistor. In the driving transistor 1007, an active layer is wound so that the L/W thereof is allowed to be higher than that of the current control transistor 1008. The reference numeral 1009 corresponds to a pixel electrode, and emits light in a region (a light emitting area) 1010 that is overlapped with an electroluminescent layer and a cathode (both not shown in the figure).

Moreover, the top view of the present invention is only one embodiment, and it is needless to say that the present invention is not limited to this.

[Embodiment 2]

In this embodiment, one embodiment of a structure of a driving transistor is described. FIG. 6 shows a cross-sectional view taken along the direction of a channel length of the driving transistor in this embodiment. The driving transistor which is shown in FIG. 6 includes an active layer 601, a gate insulating layer 602 which is in contact with the active layer 601, and a gate electrode 603 which is overlapped with the active layer 601 with the gate insulating layer 602 therebetween. Moreover, in FIG. 6, the gate electrode 603 is made up of one layer of conductive film, but may be made up of two or more layers of conductive films.

The active layer 601 includes a channel forming region 604 which is overlapped with the gate electrode 603 with the gate insulating layer 602 therebetween, a source region 605 and a drain region 606 with the channel forming region 604 therebetween, and an LDD region 607 which exists between the source region 605 and the drain region 606 and the channel forming region 604. In the present invention, a threshold voltage is controlled by adjusting a density of an impurity region which is added to the channel forming region 604. Moreover, in the present invention, the driving transistor operates in the saturated region.

In the saturated region, a depletion layer of a drain joint portion is overhanging, and an inversion layer (channel) is disappeared in a drain edge. A boundary point between a part in which the channel exists and a part in which the channel disappears is referred to as a pinch-off point. In addition, a carrier moves by being drawn from the pinch-off point to the drain region by a drain electric field. Therefore, a height of the drain current is determined by the number of carriers that can pass through the channel, and a height of a potential barrier that carriers between the pinch-off point and the drain region have to surmount.

When the pinch-off point exists in the channel forming region 604, the height of the potential barrier depends on its crystallinity more than an impurity concentration in the channel forming region 604. Therefore, when a crystallinity of a semiconductor film that is used for the active layer varies, the amount of the drain current varies since the height of the potential barrier depends on its crystallinity. Consequently, in this embodiment, the position is controlled by adjusting its drain voltage and an impurity concentration in the LDD region or the like so that the pinch-off point is formed in the LDD region 607 on the side of the drain region 606. The height of the potential barrier depends on the impurity concentration in the LDD region more than its crystallinity of the semiconductor film since the pinch-off point is in the LDD region 607 on the side of the drain region 606. Therefore, the variation of the drain current due to a crystalline variation can be controlled.

[Embodiment 3]

In this embodiment, structures of a signal line driver circuit and a scanning line driver circuit that are used for a light emitting device of the present invention are described. FIG. 7A is a block diagram of a signal line driver circuit 701, which includes a shift register 702, a latch A 703, and a latch B 704. In the signal line driver circuit 701, a clock signal (CLK) and a start pulse (SP) are inputted to the shift register 702. The shift register 702 sequentially generates a timing signal based on the clock signal (CLK) and the start pulse (SP). Then, the timing signal is supplied to a circuit in the succeeding stage in series through a buffer (not shown in the figure) or the like.

The timing signal from the shift register 702 is buffer-amplified by the buffer or the like. A load capacitance (parasitic capacitance) is large since a large number of circuits and elements are connected to a wiring to which the timing signals are supplied. The buffer is provided in order to prevent "dullness" in the rise and fall of the timing signal due to the large load capacitance. In addition, the buffer is not necessary provided. The timing signal that is buffer-amplified by the buffer is supplied to the latch A 703. The latch A 703 has a plurality of latch stages for processing an n-bit digital video signal. The latch A 703 takes in and stores an n-bit digital video signal in series which is supplied from external of the signal line driver circuit 701 when the above-mentioned timing signal is inputted When the video signal is taken in the latch A 703, the video signal may be sequentially inputted into the plurality of stages in the latch A 703. However, the present invention is not limited to this structure. A so-called division driving may be performed, in which the latches in the plurality of stages in the latch A 703 are divided into several groups and the video signal is inputted to every group in parallel and simultaneously. At this time, the number of the groups is referred to as the division number. For example, in the case where the latches are divided into four groups, it can be said as driving through the four-division. When data of the latch A703 is written in all latches, a latch signal is supplied to the latch B 704. At this moment, the video signal that is written and stored in the latch A 703 is simultaneously sent to the latch B 704of all stages and is written therein. The period when a data is sent from the latch A 703 to the latch B 7004is called a latch period.

The video signal is written again into the latch A 703 that has finished sending the video signal to the latch B 704, which is performed based on the timing signal from the shift register 702. During one line period in the second turn, the video signal that has been written again into and stored in the latch B 704is inputted to the signal line.

FIG. 7B is a block diagram that shows a structure of a scanning line driver circuit. A scanning line driver circuit 705 includes a shift register 706 and a buffer 707 respectively. In some cases, a level shifter may be included. In the scanning line driver circuit 705, a timing signal from the shift register 706 is supplied to the buffer 707, and is supplied to a corresponding scanning line (or a first scanning line, a second scanning line). Gates of switching transistors (or an erasing transistors) of pixels of one line is connected to the scanning line. Moreover, a buffer that can pass much current is used since switching transistors (or an erasing transistor) of pixels per one line must turn ON simultaneously.

[Embodiment 4]

In this embodiment, an external appearance of a light-emitting device of the present invention is described with reference to FIG. 8. FIG. 8 is a top view of the light emitting device which is formed by sealing a device substrate provided with a transistor by using a sealing member. FIG. 8B is a cross-sectional view taken along A-A' of FIG. 8A, and FIG. 8C is a cross-sectional view taken along B-B' of FIG. 8A.

A seal member 4009 is provided to surround a pixel portion 4002, a signal line driver circuit 4003, and scanning line driver circuits 4000a, 4000b, all of which are provided over a substrate 4001. Further, a cover member 4008 is provided over the pixel portion 4002, the signal line driver circuit 4003, and the scanning line driver circuits 4004a, 4004b. Thus, the pixel portion 4002, the signal line driver circuit 4003, and the scanning line driver circuits 4004a, 4004b are sealed with a filler 4210 by the substrate 4001, the seal member 4009 and the cover member 4008.

Further, the pixel portion 4002, the signal line driver circuit 4003, and the scanning line driver circuits 4004a, 4004b, which are provided over the substrate 4001, have a plurality of transistors. In FIG. 8B, a driving transistor (note that an n-channel transistor and a p-channel transistor are illustrated here) 4201 which is included in the signal line driver circuit 4003 and a transistor 4202 which is included in the pixel portion 4002, which are formed over a base film 4011, are shown, typically.

An interlayer insulating film (a leveling film) 4301 is formed over the driving transistor 4201 and the transistor 4202, and an anode (anode) 4203 that is electrically connected to a drain of the transistor 4202 is formed thereon. A transparent conductive film having a large work function is used for the anode 4203. A compound of indium oxide and tin oxide, a compound of indium oxide and zinc oxide, zinc oxide, tin oxide or indium oxide can be used for the transparent conductive film. The transparent conductive film may be added with gallium.

Then, an insulating film 4302 is formed over the anode 4203, and in the insulating film 4302, an opening portion is formed over the anode 4203. In this opening portion, an electroluminescent layer 4204 is formed over the anode 4203. A known organic electroluminescent material or an inorganic electroluminescent material can be used for the electroluminescent layer 4204. Further, either a low molecule weight compound series (monomer series) or a high molecule weight compound series (polymer series) may be used as the organic electroluminescent material. A known vapor deposition technique or an application method technique may be used as a method of forming the electroluminescent layer 4204. Further, the structure of the electroluminescent layer may employ a lamination structure or a single layer structure by freely combining a hole injection layer, a hole transporting layer, a light emitting layer, an electron transporting layer, or an electron injection layer.

A cathode 4205 that is made of a conductive film having light-shielding property (typically, a conductive film containing aluminum, copper or silver as its main constituent or a lamination film of the conductive film and another conductive film) is formed over the electroluminescent layer 4204. Moreover, it is desirable that moisture or oxygen that exist on an interface between the cathode 4205 and the electroluminescent layer 4204 are removed as much as possible. Therefore, such a device is necessary that the electroluminescent layer 4204 is formed in nitrogen or a rare gas atmosphere, and then, the cathode 4205 is formed without exposure to oxygen or moisture. In this embodiment, the above-mentioned film formation is possible by using a multi-chamber type (cluster tool type) film formation device. Moreover, a predetermined voltage is applied to the cathode 4205.

As described above, a light emitting element 4303 that includes the anode 4203, the electroluminescent layer 4204 and the cathode 4205 is formed. Further, a protective film 4209 is formed over the insulating film 4302 to cover the light emitting element 4303. The protective film 4209 is effective in preventing oxygen, moisture, or the like from intruding into the light emitting element 4303.

Reference numeral 4005a denotes a lead wiring that is connected to a power supply line, and is electrically connected to a source of the transistor 4202. The lead wiring 4005a is led between the seal member 4009 and the substrate 4001, and is electrically connected to an FPC wiring 4301 of an FPC 4006 via an anisotropic conductive film 4300.

As the cover member 4008, a glass member, a metal member (typically, stainless member), a ceramics member or a plastic member (including a plastic film) can be used. As the plastic material, an FRP (Fiberglass-Reinforced Plastics) plate, a PVF (polyvinyl fluoride) film, a Mylar film, a polyester film, or an acrylic resin film can be used. Further, a sheet with a structure in which an aluminum foil is sandwiched with a PVF film or a Mylar film can be also used.

However, in the case where light is emitted in the direction of the cover member, the cover member needs to be transparent. In this case, a transparent substance such as a glass plate, a plastic plate, a polyester film or an acrylic film is used.

Further, in addition to an inert gas such as nitrogen or argon, an ultraviolet curable resin or a thermosetting resin can be used as the filler 4210, and PVC (polyvinyl chloride), acrylic, polyimide, epoxy resin, silicon resin, PVB (polyvinyl butyral) or EVA (ethylene vinyl acetate) can be used. In this embodiment, nitrogen is used as the filler.

Moreover, a concave portion 4007 is provided on the face of the cover material 4008 on the substrate 4001 side, and a hygroscopic substance or a substance 4207 that can absorb oxygen is arranged therein in order that the filler 4210 is exposed to the hygroscopic substance (preferably, barium oxide) or the substance that can absorb oxygen. Then, the hygroscopic substance or the substance that can absorb oxygen 4207 is held in the concave portion 4007 by a concave portion cover member 4208 such that the hygroscopic substance or the substance that can absorb oxygen 4207 is not scattered. Note that the concave portion cover member 4208 has a fine mesh form, and has a structure in which air or moisture is penetrated while the hygroscopic substance or the substance that can absorb oxygen 4207 is not penetrated. The deterioration of the light emitting element 4303 can be suppressed by providing the hygroscopic substance or the substance that can absorb oxygen 4207.

As shown in FIG. 8C, the anode 4203 is formed, and at the same time, a conductive film 4203a is formed so as to be in contact with the lead wiring 4005a. Further, the anisotropic conductive film 4300 has a conductive filler 4300a. The conductive film 4203*a* over the substrate 4001 and the FPC wiring 4301*a* over the FPC 4006 are electrically connected to each other by the conductive filler 4300*a* by heat-pressing the substrate 4001 and the FPC 4006.

[Embodiment 5]

A light emitting device using a light emitting element is a self-luminous type, and thus exhibits more excellent visibility in a light place, and further has a wider viewing angle as compared to a liquid crystal display device. Therefore, the light emitting device can be applied to a display portion in various kinds of electronic devices.

The electronic devices using a light emitting device of the present invention include a video camera, a digital camera, a goggle type display (head mounted display), a navigation system, a sound reproduction device (a car audio equipment, an audio component or the like), a lap-top computer, a game machine, a portable information terminal (a mobile computer, a mobile phone, a portable game machine, an electronic book, and the like), an image reproducing device provided with recording medium (typically, a device provided with a display that can reproduce a recording medium such as DVD: digital versatile disc) and display the image) and the like. Especially, it is desirable that the light emitting device is employed for the portable information terminal whose display is watched from an oblique direction, since a width of a viewing angle is emphasized in the portable information terminal.

FIG. 9A shows a display device which includes a casing 2001, a support table 2002, a display portion 2003, a speaker portion 2004, a video input terminal 2005 and the like. The display device of the present invention is completed by using the light-emitting device of the present invention for the display portion 2003. The light emitting device is the self-luminous type and thus requires no backlight. Therefore, the light emitting device can have a thinner display portion than that of the liquid crystal display device. Note that the light emitting element display device includes all display devices for displaying information, for example, a personal computer, a receiver of TV broadcasting and an advertising display.

FIG. 9B shows a digital still camera which includes a main body 2101, a display portion 2102, an image receiving portion 2103, an operation key 2104, an external connection port 2105, a shutter 2106, and the like. The digital still camera of the present invention is completed by using the light emitting device of the present invention for the display portion 2102.

FIG. 9C shows a laptop computer which includes a main body 2201, a casing 2202, a display portion 2203, a keyboard 2204, an external connection port 2205, a pointing mouse 2206, and the like. The laptop computer of the present invention is completed by using the light emitting device of the present invention for the display portion 2203.

FIG. 9D shows a mobile computer which includes a main body 2301, a display portion 2302, a switch 2303, an operation key 2304, an infrared port 2305, and the like. The mobile computer of the present invention is completed by using the light emitting device of the present invention for the display portion 2302.

FIG. 9E shows a portable image reproducing device provided with recording medium (specifically, a DVD reproduction device), which includes a main body 2401, a casing 2402, a display portion A 2403, a display portion B 2404, a recording medium (DVD or the like) reading portion 2405, an operation key 2406, a speaker portion 2407 and the like. The display portion A 2403 is used mainly for displaying image information, and the display portion B 2404 is used mainly for displaying character information. In addition, the image reproducing device provided with recording medium further includes a home video game machine and the like. The image reproducing device of the present invention is completed by using the light emitting device of the present invention for the display portions A 2403 and B 2404.

FIG. 9F shows a goggle type display (head mounted display) which includes a main body 2501, a display portion 2502, an arm portion 2503 and the like. The goggle type display of the present invention is completed by using the light emitting device of the present invention for the display portion 2502.

FIG. 9G shows a video camera which includes a main body 2601, a display portion 2602, a casing 2603, an external connection port 2604, a remote control receiving portion 2605, an image receiving portion 2606, a battery 2607, a sound input portion 2608, an operation key 2609, an eye piece 2610, and the like. The video camera of the present invention is completed by using the light emitting device of the present invention to the display portion 2602.

FIG. 9H shows a mobile phone which includes a main body 2701, a casing 2702, a display portion 2703, a sound input portion 2704, a sound output portion 2705, an operation key 2706, an external connection port 2707, an antenna 2708, and the like. Note that, in the display portion 2703, consumption current of the mobile phone can be suppressed by displaying white-colored characters on a black-colored background. The mobile phone of the present invention is completed by using the light emitting device of the present invention for the display portion 2703.

In addition, when luminance of light emitted from an organic electroluminescent material becomes higher in the future, the light-emitting device can be used for a front or a rear projector by enlarging and projecting light that contains outputted image information through a lens or the like.

The above-mentioned electronic device is more likely to be used for display information distributed through a telecommunication path such as Internet, a CATV (cable television system) or the like, and in particular, has more opportunities of displaying moving picture information. The light emitting device is suitable for displaying moving pictures since the response speed of an organic electroluminescent material is much faster.

In addition, a portion that is emitting light consumes power in the light emitting device, thus it is desirable to display information in such a manner that the light emitting portion therein becomes as small as possible. Accordingly, in the case where the light emitting device is applied to a display portion which mainly displays character information like a portable information terminal, and particularly, a mobile phone or a sound reproduction device, it is desirable to drive it so that the character information is shown in a light emitting portion by using a non-emission portion as the background.

As described above, the range in which the present invention is applied is extremely wide, and can be applied to electronic devices in all fields. The electronic device in this embodiment may employ a light emitting device having any one of structures shown in Embodiments 1 through 6.

[Embodiment 6]

A transistor used in the present invention may be formed by using amorphous silicon. In the case where the transistor is formed by using amorphous silicon, a manufacturing method can be simplified since a crystallization process is dispensed with, and thus the cost reduction can be achieved. The transistor that is formed by using amorphous silicon is preferably not p-type but n-type, since the n-type has higher mobility and thus is more suitably applied to a pixel of a light emitting device than a p-type. In this embodiment, a cross-sectional structure of the pixel in the case where a driving transistor and a current control transistor are both n-channel transistors is described.

FIG. 11A shows a cross-sectional view of a pixel in the case where a driving transistor 6001 is n-type and light emitted from a light emitting element 6002 passes through an anode 6005 side. In FIG. 11A, a cathode 6003 of the light emitting element 6002 is electrically connected to the driving transistor 6001, and an electroluminescent layer 6004 and the anode 6005 are sequentially laminated over the cathode 6003. A known material can be used for the cathode 6003 as long as it is a conductive film which has a small work function and reflects light. For example, Ca, Al, CaF, MgAg, AlLi, and the like are desirably used. The electroluminescent layer 6004 may be structured by a single layer or a lamination of multiple layers. In the case where the layer is structured by multiple layers, an electron injection layer, an electron transporting layer, a light emitting layer, a hole transporting layer, and a hole injection layer are sequentially laminated over the cathode 6003. Note that not all of the layers are necessarily provided. The anode 6005 is formed from a transparent conductive film which transmits light, and for example, a transparent conductive film in which 2 to 20% zinc oxide (ZnO) is mixed with indium oxide may be used, in addition to an ITO.

A portion where the cathode 6003, the electroluminescent layer 6004 and the anode 6005 are overlapped corresponds to the light emitting element 6002. In the case of the pixel shown in FIG. 11A, light emitted from the light emitting element 6002 pass through the anode 6005 side as shown by the outline arrow.

FIG. 11B shows a cross-sectional view of a pixel in the case where a driving transistor 6011 is n-type and light from a light emitting element 6012 is emitted to a cathode 6013 side. In FIG. 11B, the cathode 6013 of the light emitting element 6012 is formed over a transparent conductive film 6017 which is electrically connected to the driving transistor 6011, and an electroluminescent layer 6014 and an anode 6015 are sequentially laminated over the cathode 6013. A shielding film 6016 that reflects or shuts of light is formed to cover the anode 6015. As is the case with FIG. 11A, a known material can be used for the cathode 6013 as long as it is a conductive film having a small work function, and the film is formed to be thin enough to transmit light. For example, Al having a thickness of 20 nm can be used for the cathode 6013. The electroluminescent layer 6014 may be structured by a single layer or a lamination of multiple layers, as is the case with FIG. 11A. The anode 6015 can be formed of a transparent conductive film, as is the case with FIG. 11A, although it is not required to transmit light. A light-reflective metal can be used for the shielding film 6016, for example. However, the film is not limited to a metal film. For example, a resin doped with black pigment, or the like can be used.

A portion where the cathode 6013, the electroluminescent layer 6014, and the anode 6015 are overlapped corresponds to the light emitting element 6012. In the case of the pixel shown in FIG. 11B, light which is emitted from the light emitting element 6012 pass through the cathode 6013 side as shown by the outline arrow.

It is to be noted that a current controlling transistor may be connected between the driving transistor and the light emitting element, although an example in which the driving transistor is electrically connected to the light emitting element is shown in this embodiment.

[Embodiment 7]

In this embodiment, a cross-sectional view of a pixel in the case where a driving transistor and a current control transistor are p-type is described.

FIG. 12A shows a cross-sectional view of a pixel in which a driving transistor 6021 is p-type and light which is emitted from a light emitting element 6022 passes through an anode 6023 side. In FIG. 12A, the anode 6023 of the light emitting element 6022 is electrically connected to the driving transistor 6021, and an electroluminescent layer 6024 and a cathode 6025 are sequentially laminated over the anode 6023. A known material can be used for the cathode 6205 as long as it is a conductive film which has a small work function and reflects light. For example, Ca, Al, CaF, MgAg, AlLi, and the like are desirably used. The electroluminescent layer 6024 may be structured by a single layer or a lamination of multiple layers. In the case where the layer is structured by multiple layers, a hole injection layer, a hole transporting layer, a light emitting layer, an electron transporting layer, and an electron injection layer are sequentially laminated over the anode 6023. Note that not all of the layers are necessarily provided. The anode 6023 is formed from a transparent conductive film that transmits light, and for example, a transparent conductive film in which 2 to 20% zinc oxide (ZnO) is mixed with indium oxide may be used, in addition to an ITO.

A portion where the anode 6023, the electroluminescent layer 6024, and the cathode 6025 are overlapped corresponds to the light emitting element 6022. In the case of the pixel shown in FIG. 12A, light which is emitted from the light emitting element 6022 pass through the anode 6023 side as shown by the outline arrow.

FIG. 12B shows a cross-sectional view of a pixel in which a driving transistor 6031 is p-type and light which is emitted from a light emitting element 6032 passes through an cathode 6035 side. In FIG. 12B, an anode 6033 of the light emitting element 6032 is formed over a wiring 6037 which is electrically connected to the driving transistor 6031, and an electroluminescent layer 6034 and a cathode 6035 are sequentially laminated over the anode 6033. According to the above-mentioned structure, the light is reflected on the wiring 6037 even when light is reflected off the anode 6033. As is the case with FIG. 12A, a known material can be used for the cathode 6035 as long as it is a conductive film having a small work function, and the film is formed to be thin enough to transmit light. For example, Al having a thickness of 20 nm can be used for the cathode 6035. As is the case with FIG. 12A, the electroluminescent layer 6034 may be structured by a single layer or a lamination of multiple layers. The anode 6035 can be formed from a transparent conductive film, as is the case with FIG. 12A, although it is not required to transmit light.

A portion where the anode 6033, the electroluminescent layer 6034, and the cathode 6035 are overlapped corresponds to the light emitting element 6032. In the case of the pixel shown in FIG. 12B, light which is emitted from the light emitting element 6032 pass through the cathode 6035 side as shown by the outline arrow.

It is to be noted that a current control transistor may be interposed between a driving transistor and a light emitting element, although an example in which the driving transistor is electrically connected to the light emitting element is shown in this embodiment.

[Embodiment 8]

In this embodiment, a cross-sectional structure of a pixel in the case where a driving transistor and a current control transistor are both bottom-gate types is described.

FIG. 13A shows a cross-sectional view of a pixel of this embodiment. The reference numeral 6501 corresponds to a driving transistor, and the reference numeral 6502 corresponds to a current control transistor. The driving transistor 6501 includes a gate electrode 6503 which is formed over a substrate 6500 having an insulating surface, a gate insulating film 6504 which is formed over the substrate 6500 so as to cover the gate electrode 6503, and a semiconductor film 6505 which is formed over a position which is overlapped with the gate electrode 6503 with the gate insulating film 6504 therebetween. The semiconductor film 6505 includes two impurity regions 6506a and 6506b to which an impurity that gives a conductive type is added and which function as a source or a drain. In addition, the impurity region 6506a is connected to a wiring 6508.

Like the driving transistor 6501, the current control transistor 6502 includes a gate electrode 6510 which is formed over the substrate 6500 having an insulating surface, the gate insulating film 6504 which is formed over the substrate 6500 so as to cover the gate electrode 6510, and a semiconductor film 6511 which is formed over a position which is overlapped with the gate electrode 6510 with the gate insulating film 6504 therebetween. The semiconductor film 6511 includes two impurity regions 6512a and to which an impurity that gives a conductive type is added and which function as a source or a drain and. In addition, the impurity region 6512a is connected to the impurity region 6506b that is included in the driving transistor 6501 via a wiring 6513.

Both of the driving transistor 6501 and the current control transistor 6502 are covered with a protective film 6507 that is made of an insulating film. In addition, the wiring 6508 is connected to an anode 6509 via a contact hole that is formed in the protective film 6507. Moreover, the driving transistor 6501, the current control transistor 6502 and the protective film 6507 are covered with an interlayer insulating film 6520. The interlayer insulating film 6520 has an opening portion, and the anode 6509 is exposed in the opening portion. An electroluminescent layer 6521 and a cathode 6522 are formed over the anode 6509.

In FIG. 13A, a threshold voltage is controlled by adding an impurity that gives n-type conductivity to a channel forming region of the semiconductor film 6505 which is included in the driving transistor 6501 so that the driving transistor 6501 is allowed to be normally-on (depletion type). Note that the current control transistor 6502 is normally-off (enhancement type).

FIG. 13B shows a cross-sectional view of a pixel of this embodiment which is different from FIG. 13A. The reference numeral 6601 corresponds to a driving transistor, and the reference numeral 6602 corresponds to a current control transistor. The structures of the driving transistor 6601 and the current control transistor 6602 are similar to the case of FIG. 13A. However, in FIG. 13B, the driving transistor 6601 is formed over an interlayer insulating film 6603 which covers the current control transistor 6602. In addition, the driving transistor 6601 and the current control transistor 6602 are electrically connected with a wiring 6604 via a contact hole which is formed in the interlayer insulating film 6603.

In FIG. 13B, a semiconductor film 6605 included in the driving transistor 6601 controls a threshold voltage to be normally-on (depletion type) by adding an impurity that gives an n-type in film forming.

Note that, in FIG. 13A and FIG. 13B, the case where the driving transistor and the current control transistor are each n-type is described, however, they may be p-type. In this case, p-type is used for an impurity to control a threshold of the driving transistor.

[Embodiment 9]

This embodiment describes an exterior appearance of a light emitting device of the present invention in which a transistor formed from amorphous silicon is used for a pixel portion. In this embodiment, a signal line driver circuit or a scanning line driver circuit which supplies various signals to the pixel portion is manufactured separately from a panel, and are mounted on the panel by using an FPC or the like. FIG. 14A shows a top view of the panel of this embodiment, and FIG. 14B shows a cross-sectional view taken along A-A' of FIG. 14A.

In a panel that is shown in FIGS. 14A and 14B, the pixel portion 5002 which is provided over a substrate 5001 is surrounded by a seal member 5009 which is provided over the substrate 5001 likewise, and sealed between the substrate 5001 and a cover member 5008 together with a filler 5210.

A plurality of transistors and a light emitting element 5303 are formed in the pixel portion 5002. In FIG. 14B, a driving transistor 5202 that is included in the pixel portion 5002 is representatively shown. The driving transistor 5202 and the light emitting element 5303 is electrically connected. Note that an example that the driving transistor and the light emitting element is electrically connected is shown in this embodiment, but the current control transistor may be connected in series between the driving transistor and the light emitting element.

The driving transistor 5202 and the light emitting element 5303 are covered with the filler 5210. In this embodiment, a resin to which a hygroscopic substance such as barium oxide is added with is used as the filler 5210. An ultraviolet curable resin or a thermosetting resin can be used as the resin, and PVC (polyvinyl chloride), acrylic, polyimide, epoxy resin, silicone resin, PVB (polyvinyl butyral) or EVA (ethylene vinyl acetate) can be used. Note that an inert gas such as nitride or argon can be used as the filler 5210.

The reference numeral 5010 is a lead wiring that is connected to a power supply, and that is electrically connected to a source of the driving transistor 5202. The lead wiring 5010 passes through between the seal member 5009 and the substrate 5001, and is electrically connected to an FPC wiring 5301 of an FPC 5006, via an anisotropic conductive film 5300.

[Embodiment 10]

A pixel shown in FIG. 15 includes a light emitting element 804, a switching transistor 801, a driving transistor 802, a current control transistor 803, and an erasing transistor 806. In addition to the above-mentioned elements, a capacitor element 805 may be provided in the pixel. The driving transistor 802, the current control transistor 803, and the erasing transistor 806 each have the same polarity. In this embodiment, each of them has a p-type, but they may have an n-type. A threshold voltage, a value of L/W and an operating region of the driving transistor 802 and the current control transistor 803 may be set in the same way as the case of the embodiment 1.

A gate of the switching transistor 801 is connected to a first scanning line Gaj (j=1 to y). One of the source and the drain of the switching transistor 801 is connected to a signal line Si (i=1 to x), and the other is connected to each gate of the driving transistor 802 and the current control transistor 803. In addition, a gate of the erasing transistor 806 is connected to a second scanning line Gej (j=1 to y).

The driving transistor 802, the current control transistor 803 and the erasing transistor 806 are connected in series. In addition, the driving transistor 802, the current control transistor 803 and the erasing transistor 806 are connected to a power supply line Vi (i=1 to x) and the light emitting element 804 so that a current which is supplied from the power supply line Vi is supplied to the light emitting element 804 as a drain current of the driving transistor 802, the current control transistor 803 and the erasing transistor 806. In FIG. 15, a source of the erasing transistor 806 is connected to the power supply line Vi, a drain of the driving transistor 802 is connected to an electrode of the light emitting element 804, and the current control transistor 803 is provided between the erasing transistor 806 and the driving transistor 802.

Note that the driving transistor 802, the current control transistor 803 and the erasing transistor 806 may be connected in series between the power supply line Vi and the light emitting element 804, and the positional relation of the three transistors are not limited to a structure shown in FIG. 15. For example, the erasing transistor 806 may be provided between the driving transistor 802 and the current control transistor 803, or may be provided at a closer position to the light emitting element 804 than the driving transistor 802 and the current control transistor 803.

A voltage is applied from a power supply to each of a counter electrode of the light emitting element 804 and the power supply line Vi so as to supply a forward bias current to the light emitting element 804. One of the two electrodes of the capacitor element 805 is connected to the power supply line Vi, and the other is connected to each gate of the driving transistor 802 and the current control transistor 803.

The operation of the pixel shown in FIG. 15 can be described by classifying the operation into a writing period, a storage period, and an erasing period. Operations of the switching transistor 801, the driving transistor 802, and the current control transistor 803 in the writing period and the storage period are the same as in the case of FIG. 2. However, the erasing transistor 806 controls an electric potential of the second scanning line Gej so that the erasing transistor 806 turns ON in the writing period and the storage period, and turns OFF in the erasing period. When the erasing transistor 806 turns OFF in the erasing period, a state that a current is not forcibly supplied to the light emitting element 804 can be obtained.

[Embodiment 11]

A cross-sectional structure of a pixel of a light emitting element of the present invention is described with reference to FIG. 16. In FIG. 16, a transistor 7001 is formed over a substrate 7000. The transistor 7001 is covered with a first interlayer insulating film 7002, and a color filter 7003 which is formed from a resin or the like and a wiring 7004 which is electrically connected to the transistor 7001 via a contact hole are formed in the first interlayer insulating film 7002.

Moreover, a second interlayer insulating film 7005 is formed over the first interlayer insulating film 7002 to cover the color filter 7003 and the wiring 7004. Note that the first interlayer insulating film 7002 or the second interlayer insulating film 7005 is formed with a single layer or a laminated layer of a silicon oxide film, a silicon nitride film, or a silicon oxynitride film by plasma CVD or sputtering. A film that a silicon oxynitride film in which mole fraction of oxygen is higher than that of nitrogen is laminated over a silicon oxynitride film in which mole fraction of nitrogen is higher than that of oxygen, and may be used as the first interlayer insulating film 7002 or the second interlayer insulating film 7005. Alternatively, an organic resin film may be used as the first interlayer insulating film 7002 or the second interlayer insulating film 7005.

A wiring 7006 that is electrically connected to the wiring 7004 via a contact hole is formed in the second interlayer insulating film 7005. A portion of the wiring 7006 has a function of anode, and is formed in a position that is overlapped with the color filter 7003 with the second interlayer insulating film 7005 therebetween.

In addition, an organic resin film 7008 that is used as a barrier is formed over the second interlayer insulating film 7005. The organic resin film 7008 has an opening portion, and a light emitting element 7011 is formed by overlapping the wiring 7006, an electroluminescent layer 7009 and a cathode 7010 with one another in the opening portion. The electroluminescent layer 7009 has a structure of a single layer of a light emitting layer or a laminated structure of a plurality of layers including the light emitting layer. Note that a protective film may be formed over the organic resin film 7008 and the cathode 7010. In this case, a film that is less permeable to a substance that promotes a deterioration of a light emitting element, such as moisture or oxide, as compared with other insulating film, is used. Representatively, it is desirable to use a DLC film, a carbon nitride film, and a silicon nitride film that is formed by RF sputtering or the like. Moreover, it is possible to use as a protective film by laminating a film that is less permeable to the above-mentioned substance such as moisture or oxide, and a film that is more permeable to the substance such as moisture or oxide than the film.

Moreover, the organic resin film 7008 is heated under vacuum atmosphere to remove absorbed moisture, oxygen, or the like before the electroluminescent layer 7009 is formed. Specifically, the heat treatment is carried out under vacuum atmosphere within the range of 100° C. to 200° C., and for about a half hour to 1 hour. It is preferable to be equal to or less than $3 \times 10^{-7}$ Torr, and if possible, being equal to or less than $3 \times 10^{-8}$ Torr is most preferable. Moreover, in the case where the electroluminescent layer is formed after the heat treatment for the organic resin is performed on under vacuum atmosphere, the reliability can be further enhanced by keeping vacuum atmosphere just before forming the film.

In addition, as for an edge portion of the opening portion of the organic resin film 7008, the electroluminescent layer 7009 that is overlapped partly with the organic resin film 7008 is desirable to be formed roundish so that a hole is not made in the edge portion. Specifically, a curvature radius of a curve which is drawn in a cross section of the organic resin film in the opening portion is desirably in the range of approximately 0.2 to 2 μm.

According to the above-mentioned structure, coverage of an electroluminescent layer and a cathode that are formed later can be enhanced. Thus, it can be prevented that the wiring 7006 and the cathode 7010 are short-circuited in the holes that are formed in the electroluminescent layer 7009. Moreover, by relieving stress of the electroluminescent layer 7009, a defect called shrink, in which a light emitting region decreases, can be reduced and the reliability is thus enhanced.

Note that FIG. 16 shows an example in which a positive photosensitive acryl resin is used as the organic resin film 7008. The photosensitive organic resin is classified into the positive type in which the region exposed to the energy line such as light, electron, ion, or the like is removed, and the negative type in which the exposed region is left. In the present invention, the organic resin film of the negative type may be used. Moreover, the organic resin film 7008 may be formed from the photosensitive polyimide. In the case where the organic resin film 7008 is formed from the negative type acrylic, the edge portion of the opening portion becomes an S-like cross section. On this occasion, it is desirable that the curvature radius in the upper edge portion and the lower edge portion of the opening portion is in the range of 0.2 to 2 μm.

The wiring 7006 can be formed by using a transparent conductive film. A transparent conductive film in which 2 to 20% zinc oxide (ZnO) is mixed with indium oxide may be used, in addition to an ITO. In FIG. 16, an ITO is used as the wiring 7006. The wiring 7006 may be polished by CMP method or by cleaning with porous body of polyvinyl alcohols so that the surface of the wiring 7006 is flattened. Moreover, the surface of the wiring 7006 may be irradiated with ultraviolet ray or may be processed with oxygen plasma after being polishing with the CMP method.

In addition, the cathode 7010 is formed to be thin enough to transmit light. Any known material can be used for the cathode 7010 as long as it is a conductive film having a small work function. For example, Ca, Al, CaF, MgAg, AlLi, and the like are preferably used. Note that there is also a method of employing an ITO that has a small work function by adding Li, instead of a method of thinning the film, to obtain light from the cathode side. A light emitting element of the present invention may have a structure that light is emitted from both sides of the anode and the cathode.

Note that, practically, when the device in FIG. 16 has been completed, a protective film (a laminated film, an ultraviolet curable resin, or the like) having high air tightness and less degasification or a light-transmitting cover member 7012 is preferably used for packaging (sealing) the device, so as not to be further exposed to the air. At this moment, the reliability of the OLED is enhanced by filling inside of the cover member with an inert atmosphere or providing a hygroscopic member inside (for example, barium oxide). Moreover, in the present invention, a color filter 7013 may be provided for the cover member 7012.

Note that the present invention is not limited to the above-mentioned manufacturing method, and a known method can be used as well.

[Embodiment 12]

In this embodiment, one embodiment of a top view of a pixel shown in FIG. 4A is described. FIG. 17 shows a top view of a pixel of this embodiment. The reference numeral 8001 corresponds to a signal line, the reference numeral 8002 corresponds to a power supply line, the reference numeral 8004 corresponds to a first scanning line, the reference numeral 8003 corresponds to a second scanning line. In this embodiment, the signal line 8001 and the power supply line 8002 are formed from the same conductive film, and the first scanning line 8004 and the second scanning line 8003 are formed from the same conductive film. In addition, the reference numeral 8005 is a switching transistor, and a portion of the first scanning line 8004 functions as the gate electrode thereof. Moreover, the reference numeral 8006 is an erasing transistor, and a portion of the second scanning line 8003 functions as the gate electrode thereof. The reference numeral 8007 corresponds to a driving transistor, and the reference numeral 8008 corresponds to a current control transistor. In the driving transistor 8007, an active layer is wound so that the L/W thereof is allowed to be higher than that of the current control transistor 8008. The reference numeral 8009 corresponds to a pixel electrode, and emits light in a region (a light emitting area) 8010 that is overlapped with an electroluminescent layer and a cathode (both not shown in the figure).

Moreover, the top view of the present invention is only one embodiment, and it is needless to say that the present invention is not limited to this.

Figure 1A:
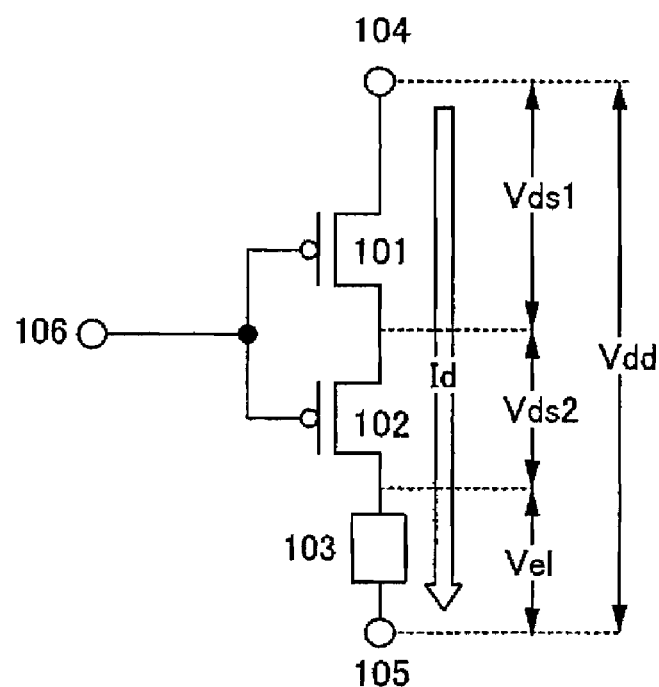
FIGS. 1A and 1B Diagrams describing an operating area of a transistor which is included in a pixel of the present invention.
Figure 1B:
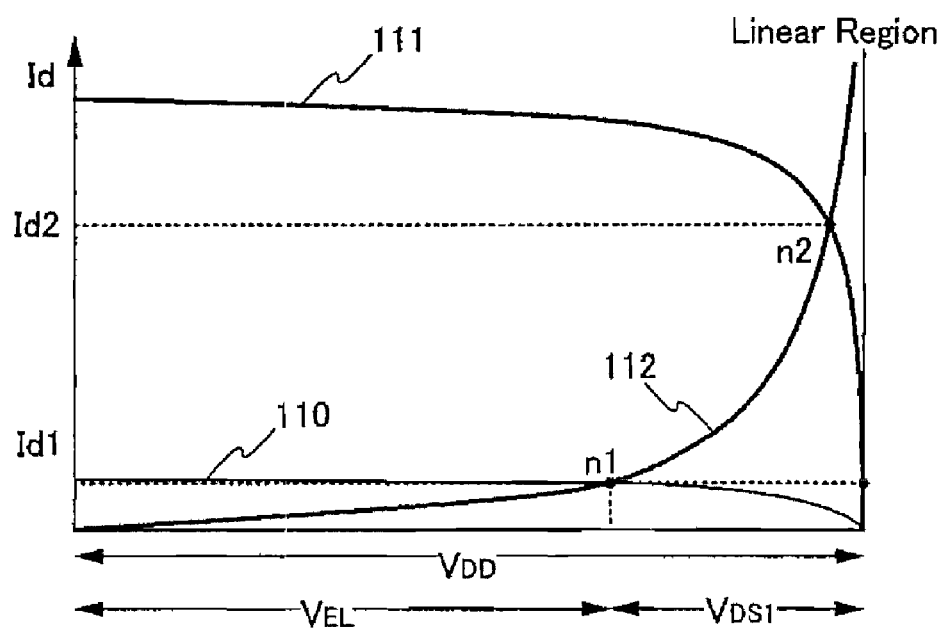
Figure 2:
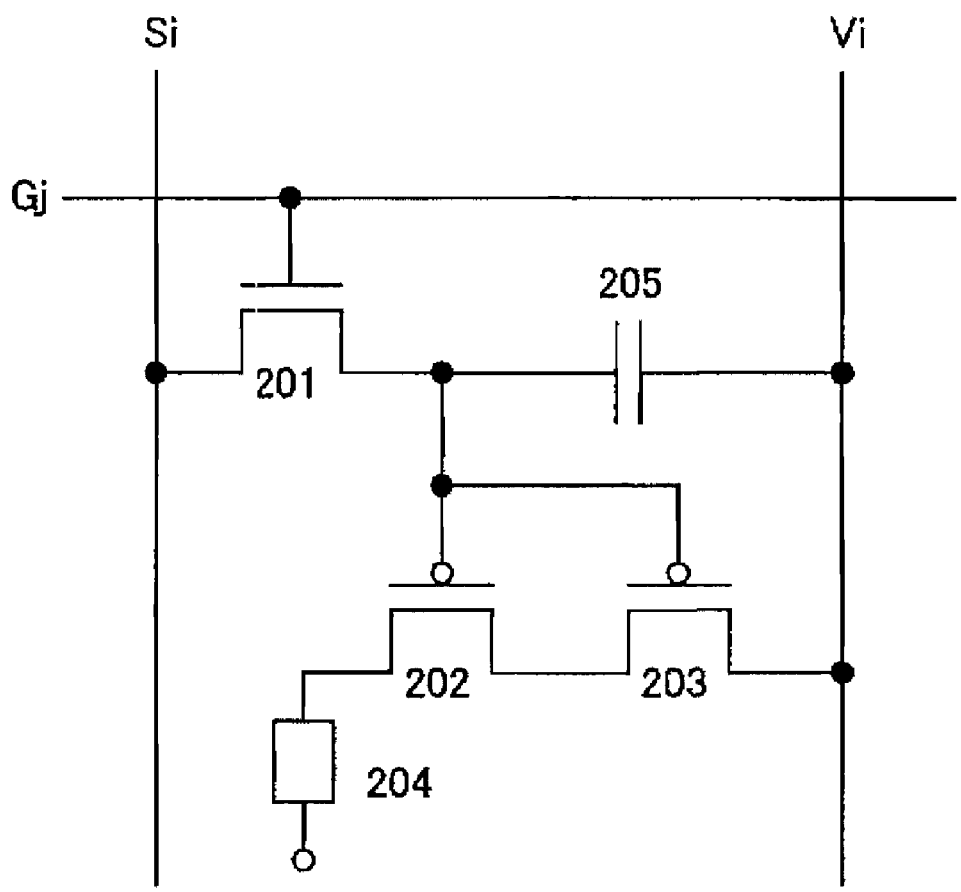
FIG. 2 A circuit diagram of a pixel of a light emitting device of the present invention.
Figure 3A:
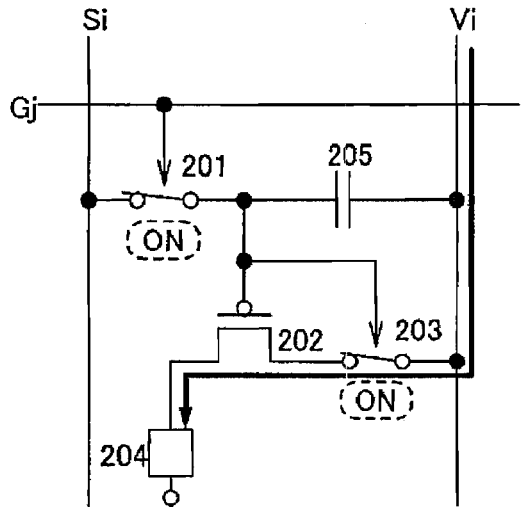
FIGS. 3A to 3D Diagrams showing an operation of a pixel shown in FIG. 2.
Figure 3B:
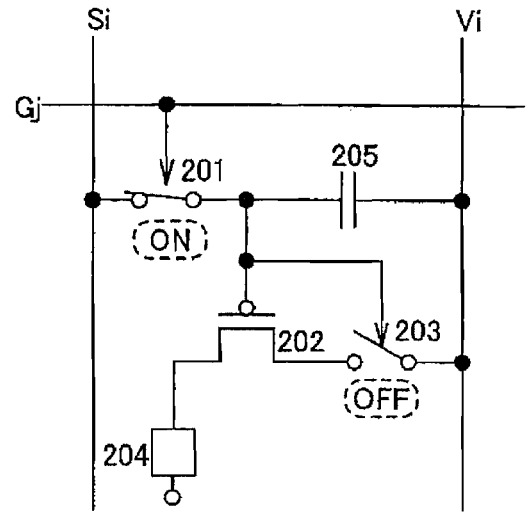
Figure 3C:
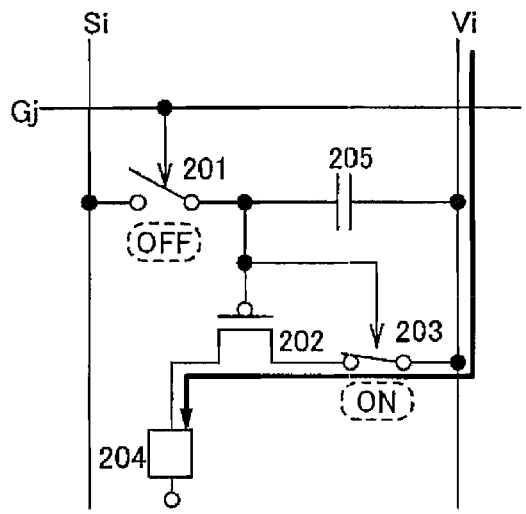
Figure 3D:
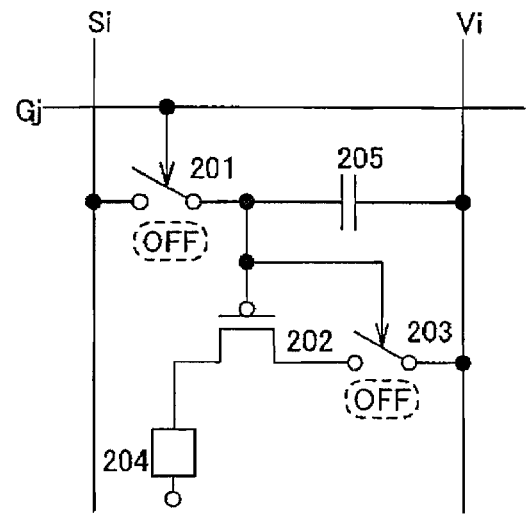
Figure 4A:
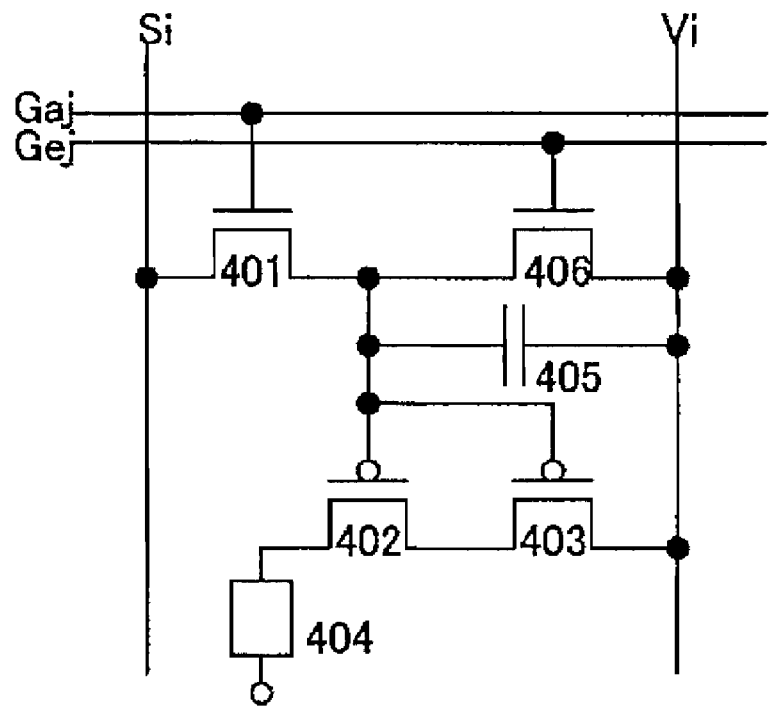
FIGS. 4A and 4B Circuit diagrams of a pixel of a light emitting device of the present invention.
Figure 4B:
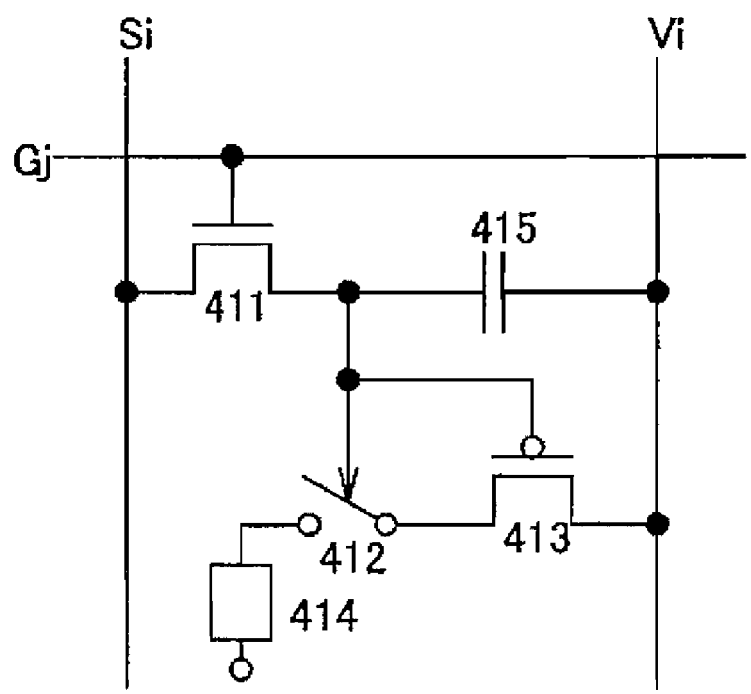
Figure 5:
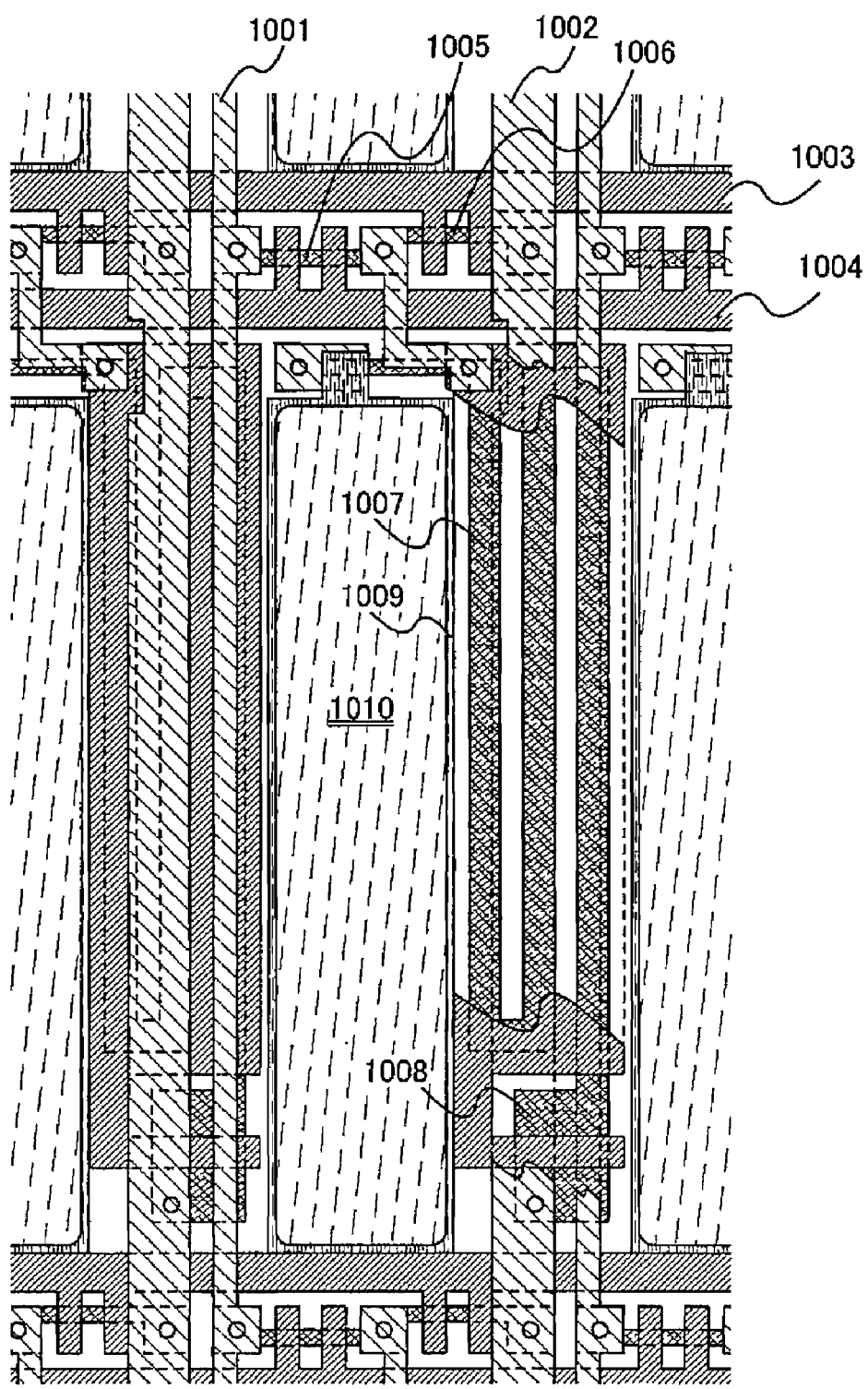
FIG. 5 A top view of a pixel of a light emitting device of the present invention.
Figure 6:
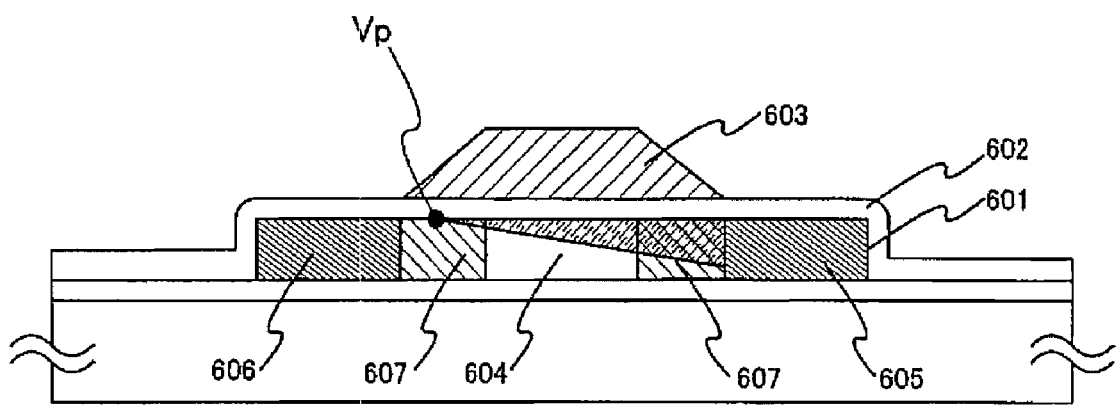
FIG. 6 A diagram showing a cross-sectional structure of a driving transistor.
Figure 7A:
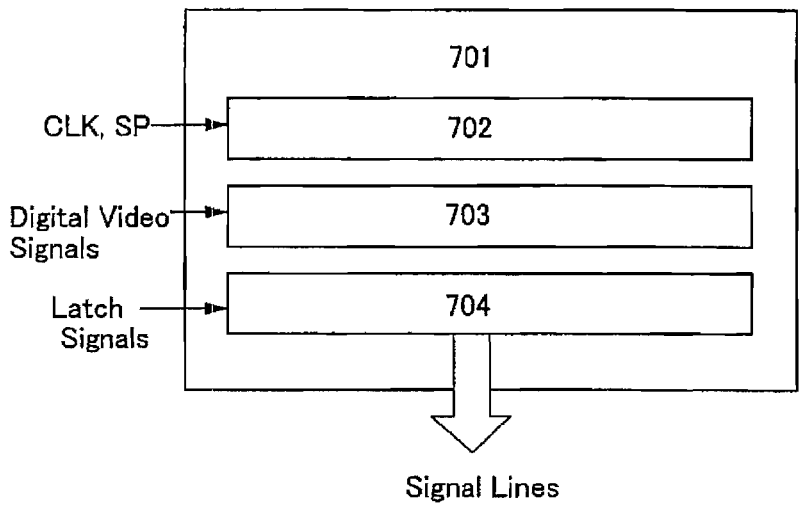
FIGS. 7A and 7B Diagrams showing structures of a driver circuit of a light emitting device.
Figure 7B:
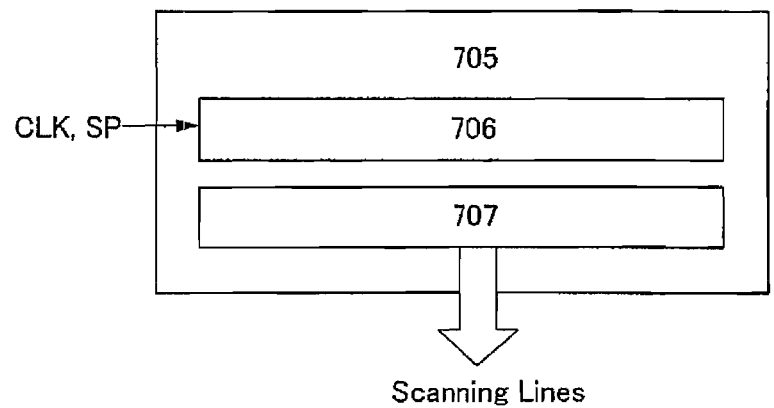
Figure 8A:
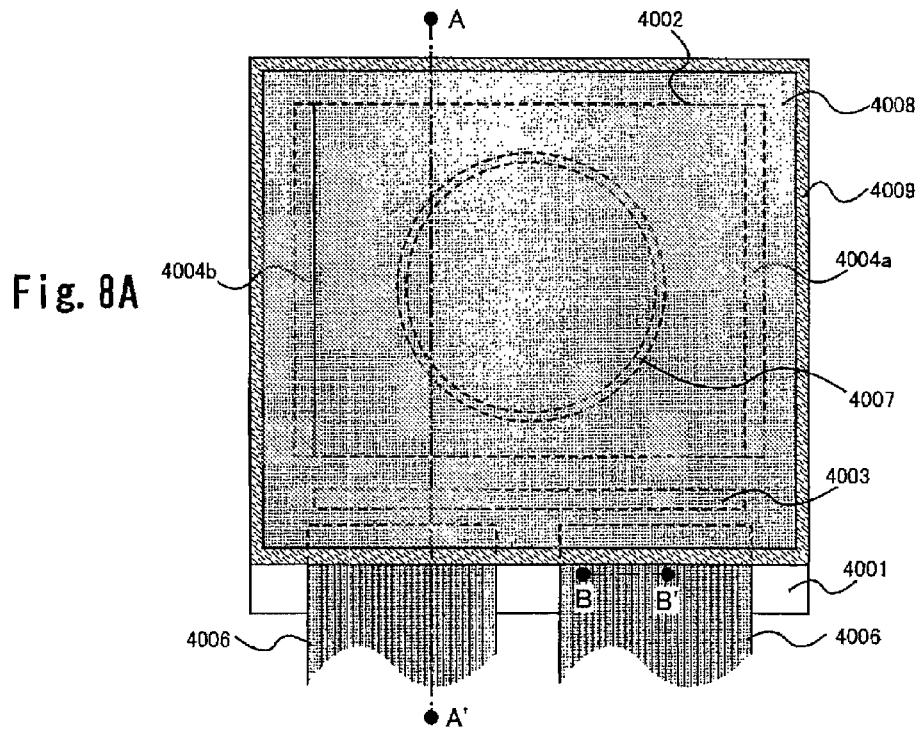
FIGS. 8A to 8C A top view and cross-sectional views of a light emitting device of the present invention.
Figure 8B:
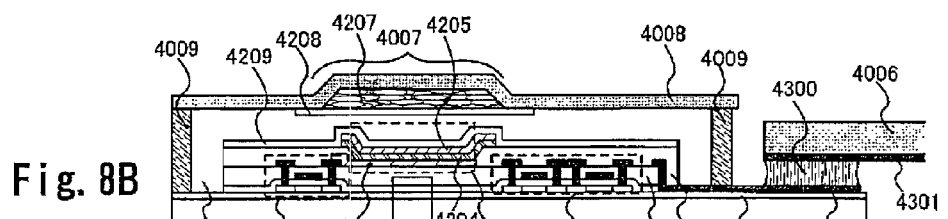
Figure 8C:
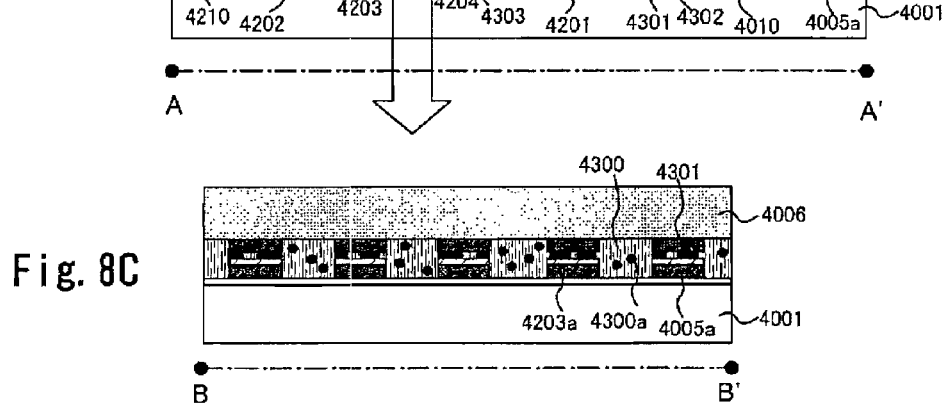
Figure 9A:
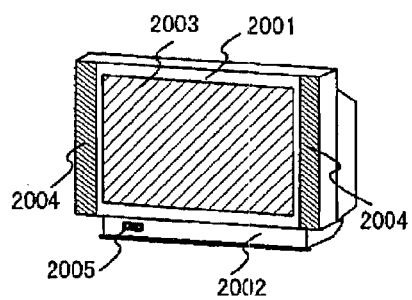
FIGS. 9A to 9H Views of electronic devices using a light emitting device of the present invention.
Figure 9B:
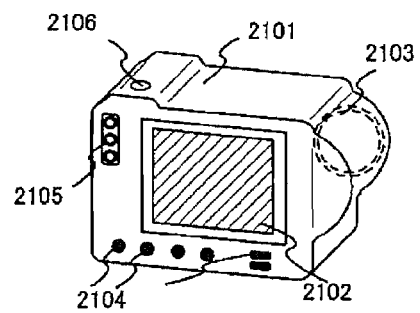
Figure 9C:
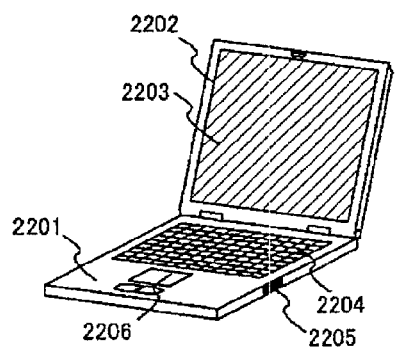
Figure 9D:
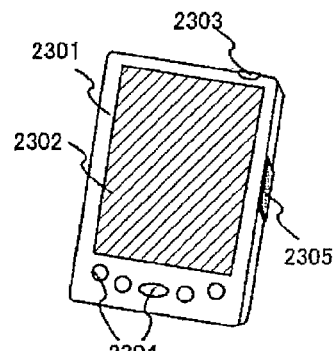
Figure 9E:
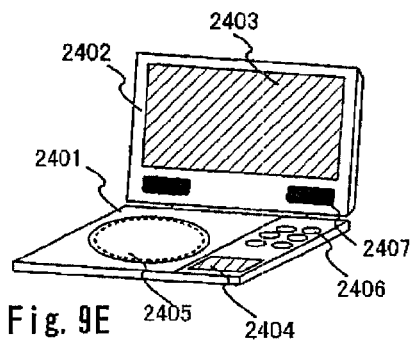
Figure 9F:
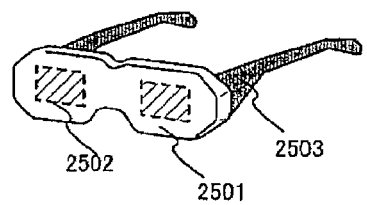
Figure 9G:
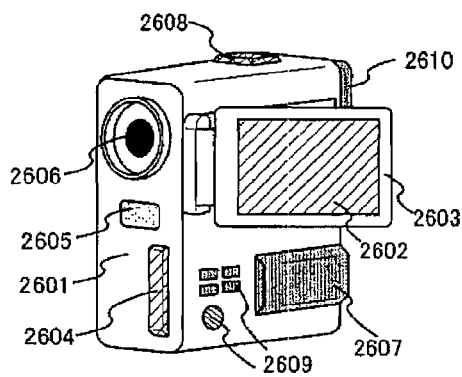
Figure 9H:
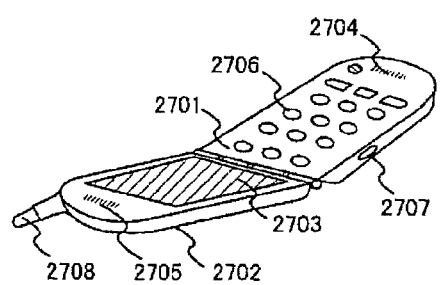
Figure 10:
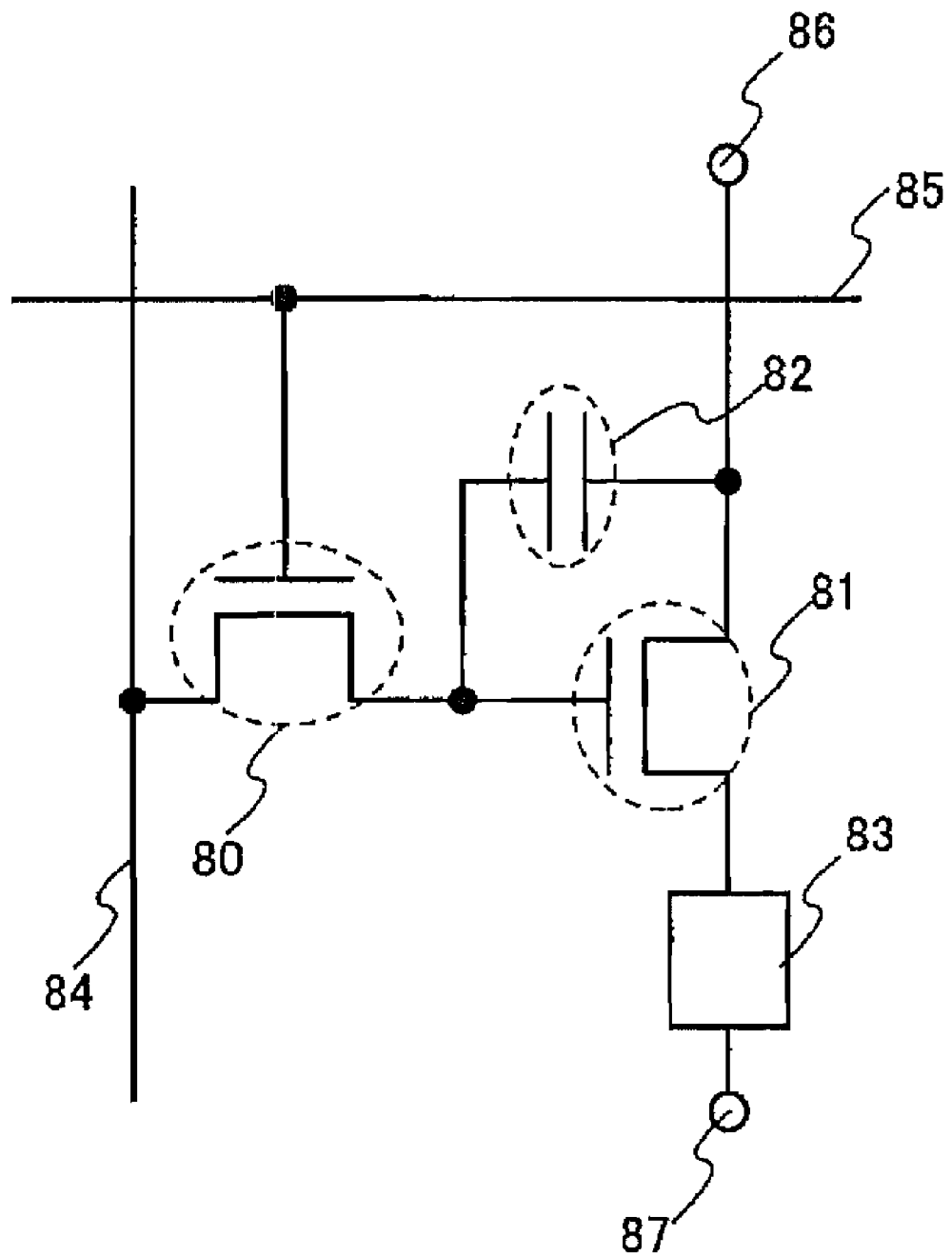
FIG. 10 A circuit diagram of a pixel of a conventional light emitting device.
Figure 11A:
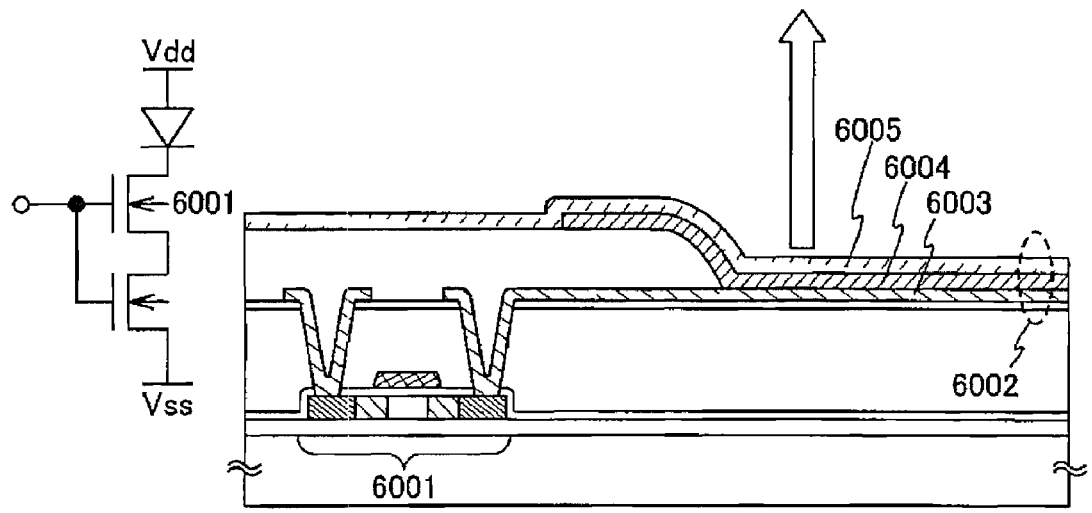
FIGS. 11A and 11B Cross-sectional views of a pixel of a light emitting device of the present invention.
Figure 11B:
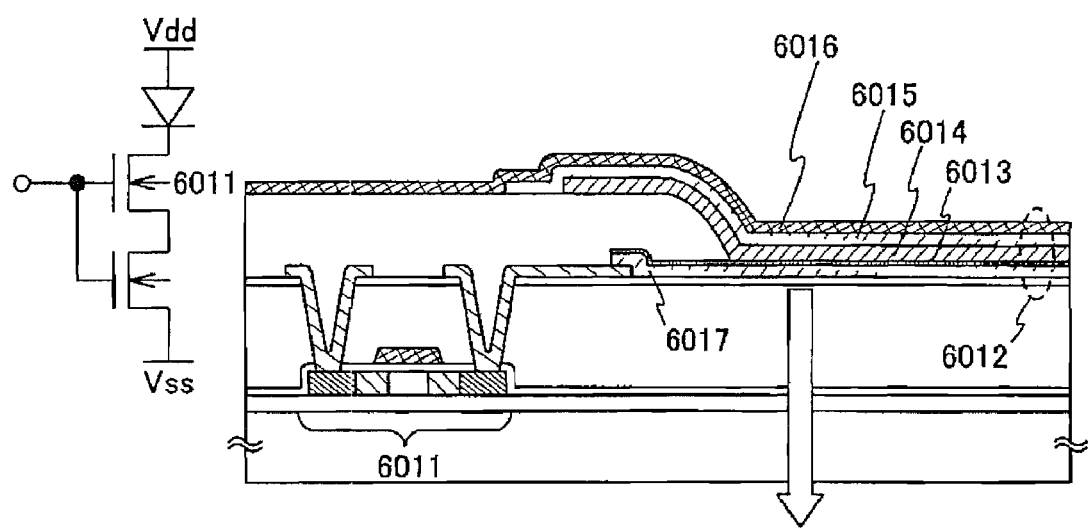
Figure 12A:
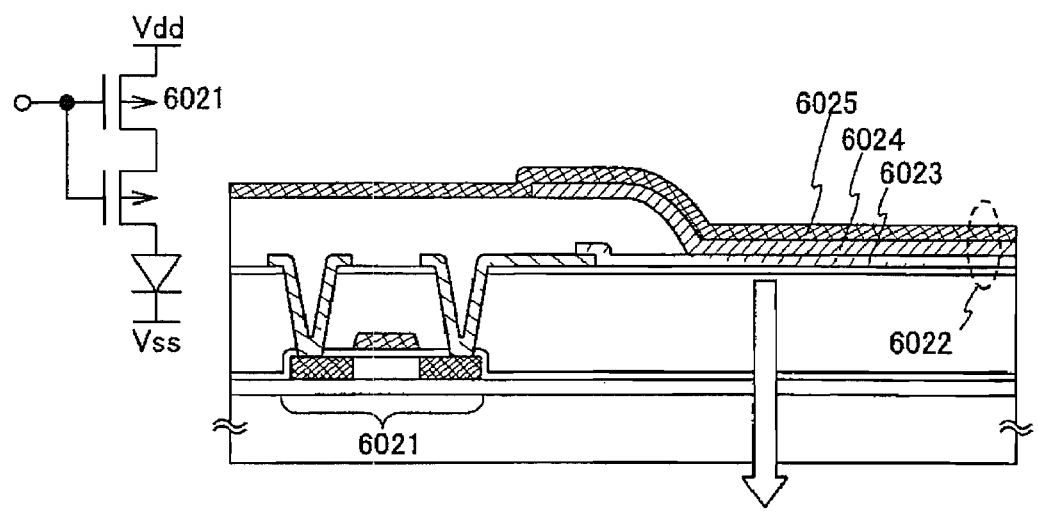
FIGS. 12A and 12B Cross-sectional views of a pixel of a light emitting, device of the present invention.
Figure 12B:
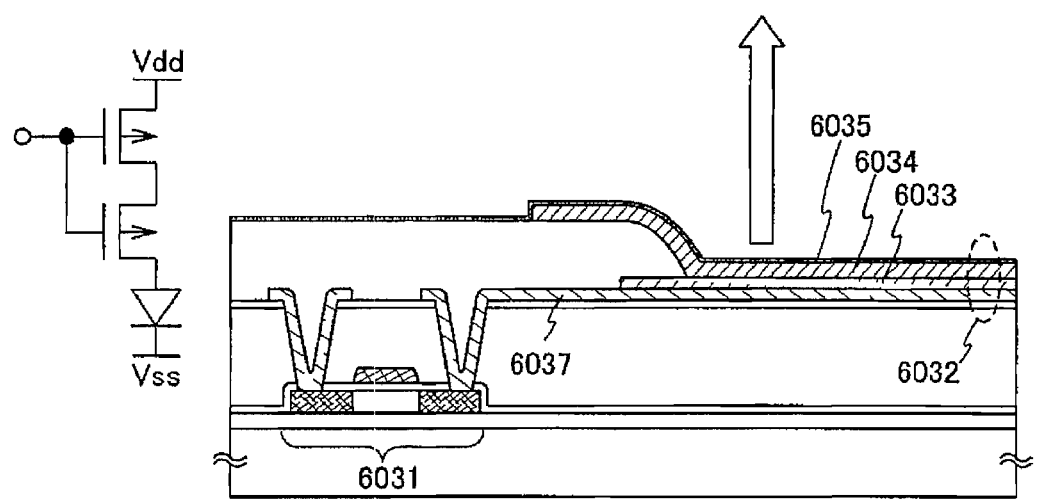
Figure 13A:
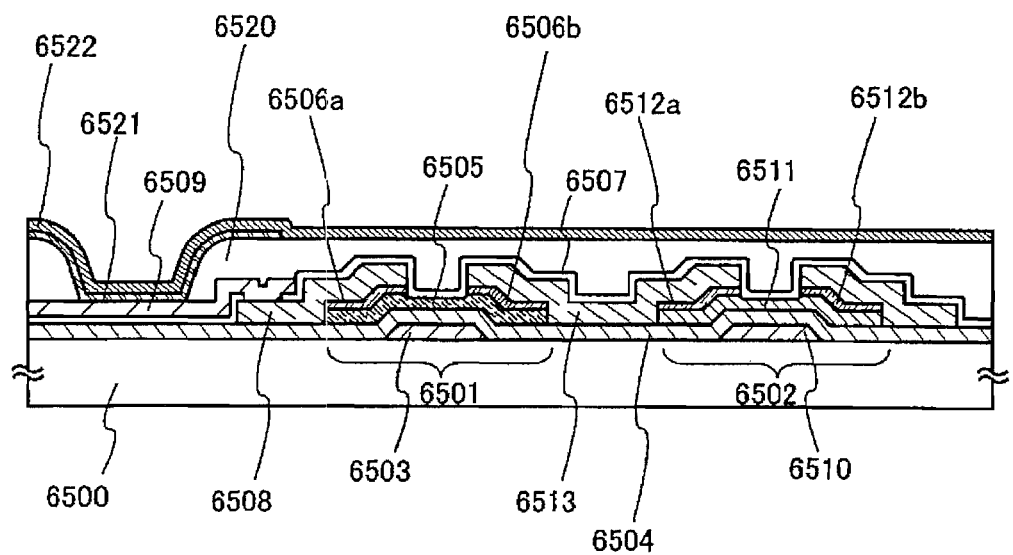
FIGS. 13A and 13B Cross-sectional views of a pixel of a light emitting device of the present invention.
Figure 13B:
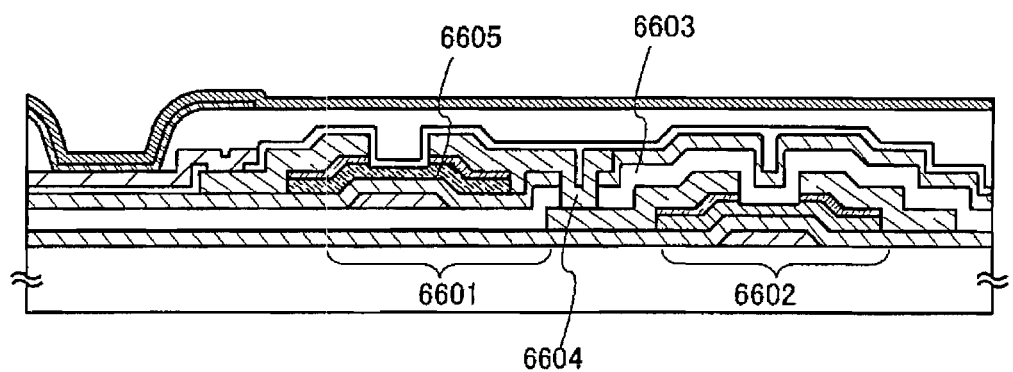
Figure 14A:
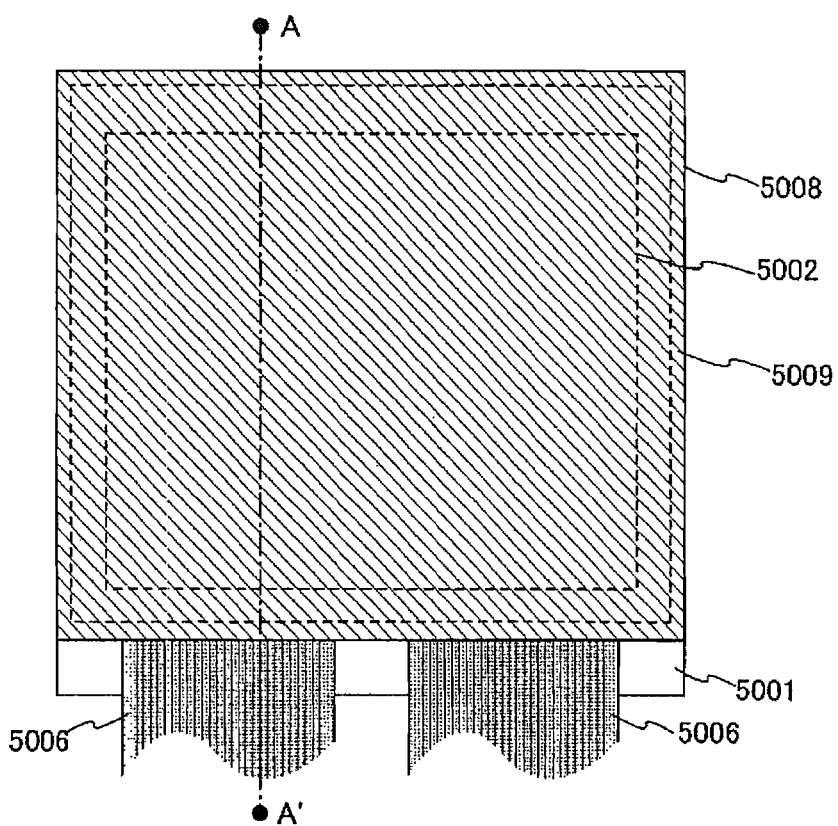
FIGS. 14A and 14B A top view and a cross-sectional view of a light emitting device of the present invention.
Figure 14B:
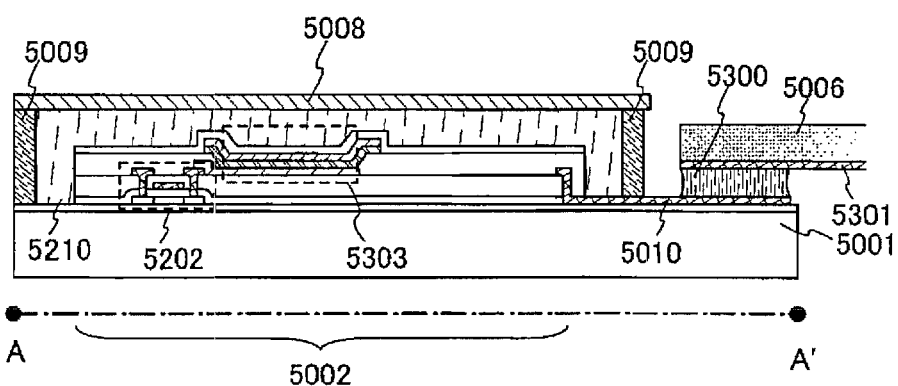
Figure 15:
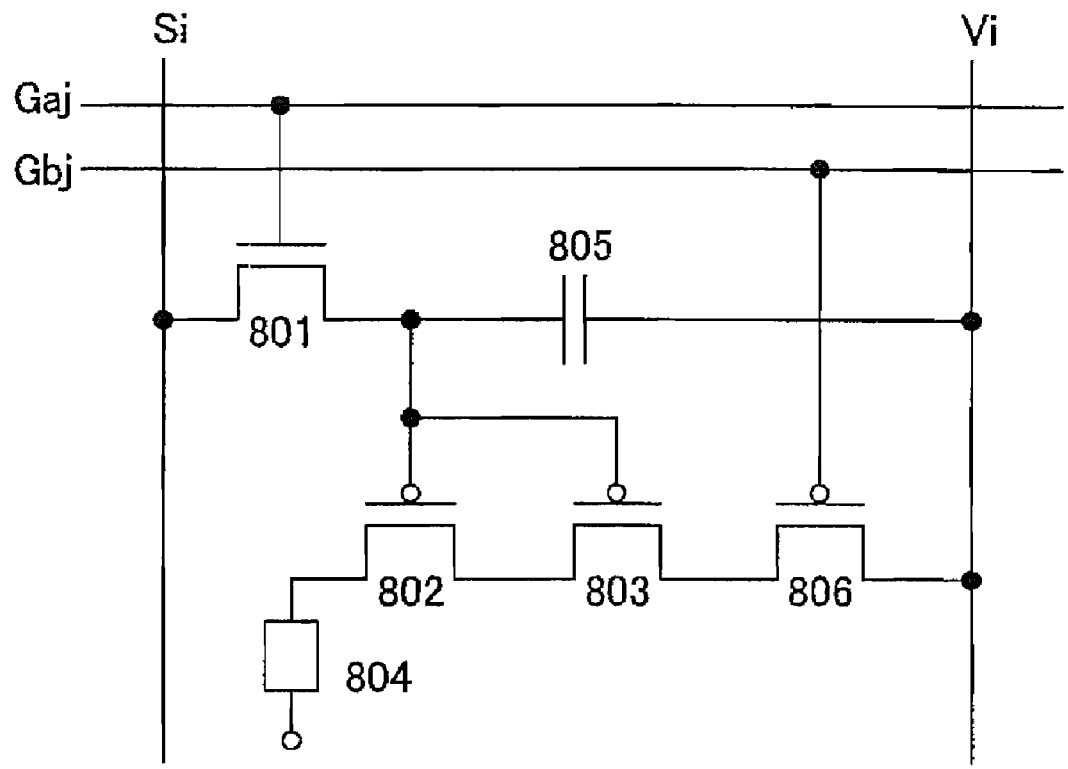
FIG. 15 A circuit diagram of a pixel of a light emitting device of the present invention.
Figure 16:
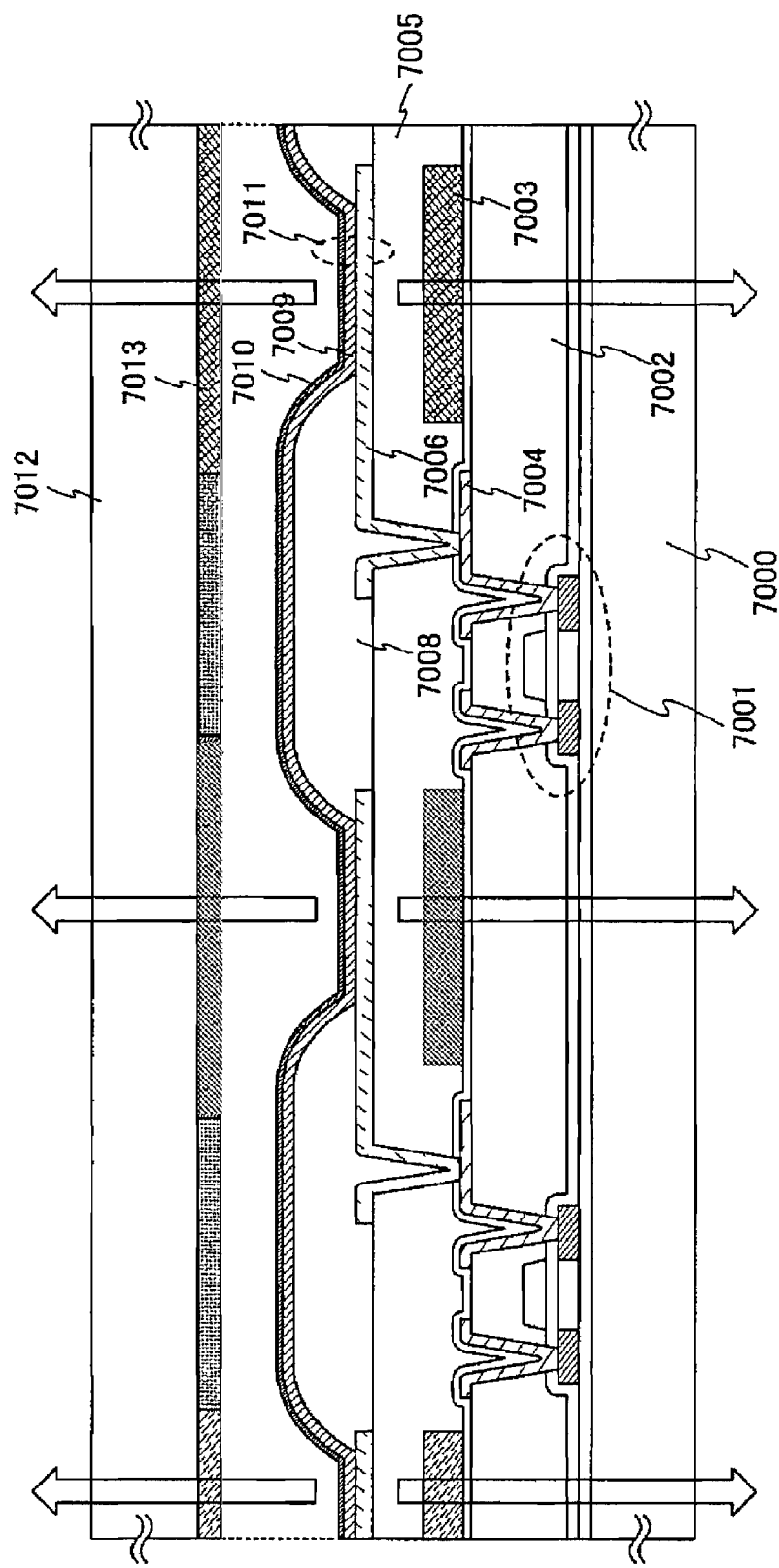
FIG. 16 A cross-sectional view of a pixel of a light emitting device of the present invention.
Figure 17:
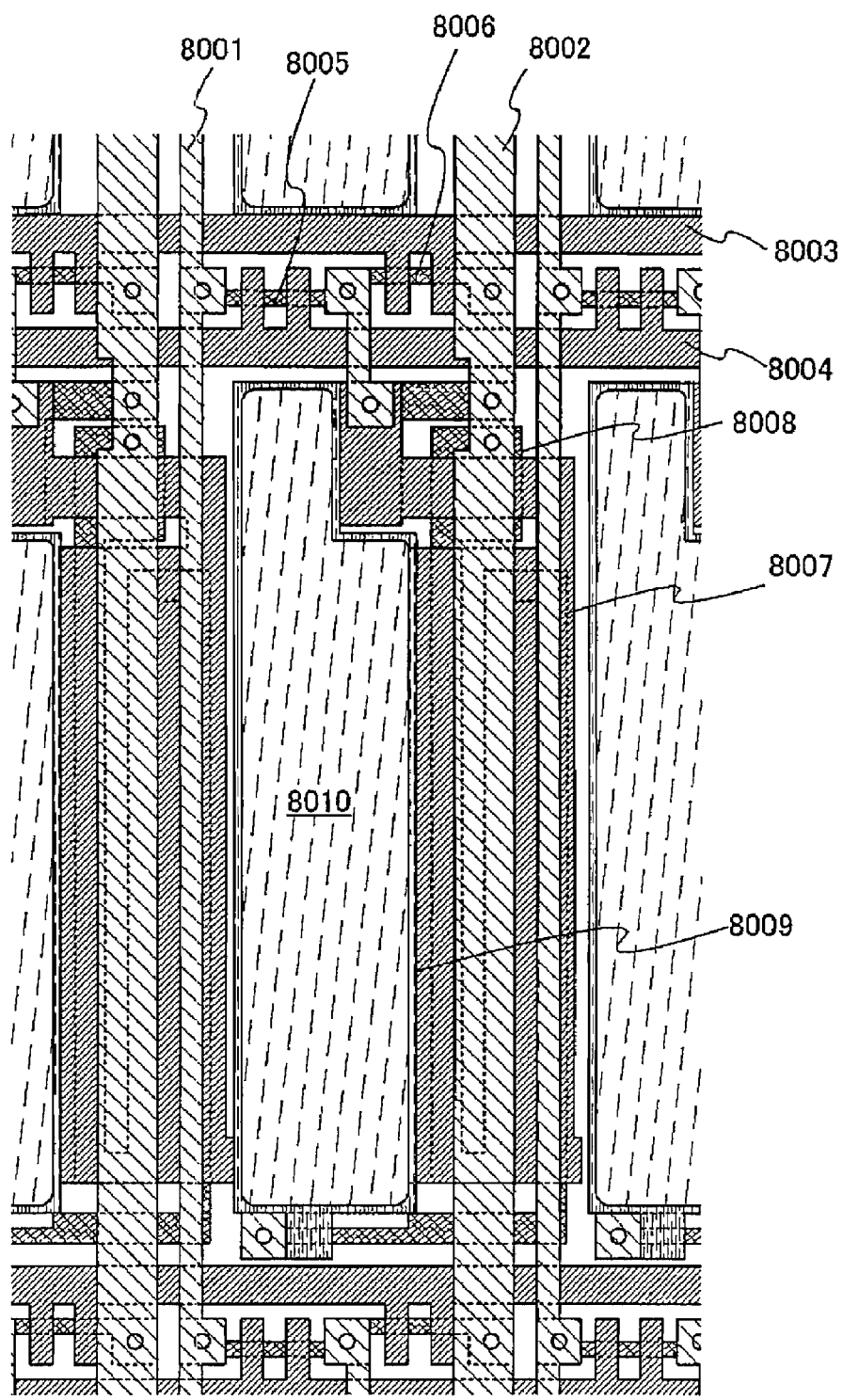
FIG. 17 A top view of a pixel of a light emitting device of the present invention. invention.

What is claimed is:

1. A light emitting device comprising:
a light emitting element and a first transistor and a second transistor each for controlling current to be supplied to the light emitting element, which are formed in a pixel,
wherein a threshold voltage of the first transistor is lower than a threshold voltage of the second transistor,
wherein a channel length of the first transistor is longer than a channel width thereof,
wherein a channel length of the second transistor is equal to or shorter than a channel width thereof,
wherein gate electrodes of the first transistor and the second transistor are connected to each other,
wherein each polarity of the first transistor and the second transistor is n-type, and
wherein the light emitting element, the first transistor and the second transistor are all connected in series.

2. The light emitting device according to claim 1, wherein a ratio of the channel length to the channel width of the first transistor is equal to or more than 5.

3. A device substrate comprising:
a pixel electrode and a first transistor and a second transistor each for controlling current to be supplied to the pixel electrode, which are formed in a pixel,
wherein a threshold voltage of the first transistor is lower than a threshold of the second transistor,
wherein a channel length of the first transistor is longer than a channel width thereof,
wherein a channel length of the second transistor is equal to or shorter than a channel width thereof,
wherein gate electrodes of the first transistor and the second transistor are connected to each other,
wherein each polarity of the first transistor and the second transistor is n-type, and
wherein the pixel electrode, the first transistor and the second transistor are all connected in series.

4. The device substrate according to claim 3, wherein a ratio of the channel length to the channel width of the first transistor is equal to or more than 5.

5. A method for driving a light emitting device, comprising the step of:

controlling current to be supplied to a light emitting element by a first transistor and a second transistor, wherein a threshold of the first transistor is lower than a threshold of the second transistor, wherein a channel length of the first transistor is longer than a channel width thereof, wherein a channel length of the second transistor is equal to or shorter than a channel width thereof, wherein gate electrodes of the first transistor and the second transistor are connected to each other, wherein each polarity of the first transistor and the second transistor is n-type, wherein the light emitting element, the first transistor and the second transistor are all connected in series, and wherein the first transistor operates in a saturated region, and the second transistor operates in a linear region.

6. The method for driving the light emitting device according to claim 5, wherein a ratio of the channel length to the channel width of the first transistor is equal to or more than 5.

* * * * *